(12) United States Patent
Li et al.

(10) Patent No.: US 10,545,599 B2
(45) Date of Patent: Jan. 28, 2020

(54) ARRAY SUBSTRATE, DISPLAY PANEL AND DISPLAY DEVICE

(71) Applicant: Xiamen Tianma Micro-Electronics Co., Ltd., Xiamen (CN)

(72) Inventors: Yanmei Li, Xiamen (CN); Xuexin Lan, Xiamen (CN); Huangyao Wu, Xiamen (CN)

(73) Assignee: XIAMEN TIANMA MICRO-ELECTRONICS CO., LTD., Xiamen (CN)

( * ) Notice: Subject to any disclaimer, the term of this patent is extended or adjusted under 35 U.S.C. 154(b) by 159 days.

(21) Appl. No.: 15/888,555

(22) Filed: Feb. 5, 2018

(65) Prior Publication Data

US 2018/0181249 A1    Jun. 28, 2018

(30) Foreign Application Priority Data

Sep. 6, 2017    (CN) .......................... 2017 1 0796443

(51) Int. Cl.
*G06F 3/041* (2006.01)
*G09G 3/30* (2006.01)
*H03K 17/96* (2006.01)

(52) U.S. Cl.
CPC ........ *G06F 3/04142* (2019.05); *G06F 3/0412* (2013.01); *G06F 3/0414* (2013.01); *G09G 3/30* (2013.01); *H03K 17/96* (2013.01); *H03K 2017/9606* (2013.01)

(58) Field of Classification Search
CPC ................ G06F 3/04142; H03K 17/96; H03K 2017/9606
See application file for complete search history.

*Primary Examiner* — Chad M Dicke
(74) *Attorney, Agent, or Firm* — Alston & Bird LLP

(57) ABSTRACT

An array substrate, a display panel and a display device are disclosed. The array substrate includes a base substrate, and a bias voltage applying circuit and a plurality of semiconductor pressure sensors both disposed at a side of the base substrate. The bias voltage applying circuit is electrically connected to a first power supply signal inputting terminal and a second power supply signal inputting terminal of the semiconductor pressure sensor via a first power supply signal line and a second power supply signal line, respectively, to supply a bias voltage to the semiconductor pressure sensor. A concentration of the dopant ions is higher when the related semiconductor pressure sensor is closer to the bias voltage applying circuit, so that an electrical resistance value of said semiconductor pressure sensor is lower.

20 Claims, 22 Drawing Sheets

ARRAY SUBSTRATE, DISPLAY PANEL AND DISPLAY DEVICE

CROSS-REFERENCES TO RELATED APPLICATIONS

This application claims priority to Chinese patent application No. CN201710796443.X, filed on Sep. 6, 2017, the disclosure of which is incorporated herein by reference in its entirety.

TECHNICAL FIELD

Embodiments of the present disclosure relate to the field of semiconductor technology, and, in particular, relate to an array substrate, a display panel and a display device.

BACKGROUND

At present, more and more electronic devices are equipped with touch screens, for example, information inquiring machine in a hall of a public place, computers, mobile phones used by users in daily life and work, and the like. In this way, the user can operate the electronic device just by touching icons on the touch screen with a finger, so that there is no need on keyboard and mouse operations, thereby making the human-computer interaction simpler. In order to better meet the requirement of user, the touch screen is typically provided with a pressure sensor for detecting a magnitude of a touch pressure when the user touches the touch screen.

Bridge strain sensor is a kind of pressure sensor capable of detecting the magnitude of the touch pressure. The bridge strain sensor calculates the magnitude of the touch pressure by detecting an in-plane deformation caused by a z-direction strain and measuring a change in a resistance of the sensor.

In a related art, a display panel is provided with a plurality of bridge strain sensors. Each stain sensor needs to be provided an input voltage via a wire. In order to reduce the number of wires, the strain sensors may share a voltage input wire. However, since the wire has a certain resistance, the stain sensors connected in parallel may receive different disturbed input voltages when the stain sensors share the voltage input wire. Especially, the received input voltage of the strain sensor that is remote from the input voltage is much smaller than the input voltage supplied by a voltage input device. As a result, the pressure detection sensitivity is affected.

SUMMARY

In view of this, embodiments of the present disclosure provide an array substrate, a display panel and a display device so as to solve a technical problem in the related art that semiconductor pressure sensors located at different positions receive different distributed voltages when the semiconductor pressure sensors share a power supply signal line to be connected with the voltage input device.

In a first aspect, embodiments of the present disclosure provide an array substrate. The array substrate includes a base substrate, a bias voltage applying circuit and a plurality of semiconductor pressure sensors disposed at a side of the base substrate.

the plurality of semiconductor pressure sensors each have a first power supply signal inputting terminal and a second power supply signal inputting terminal, wherein the bias voltage applying circuit is electrically connected to the first power supply signal inputting terminal via a first power supply signal line and electrically connected to the second power supply signal inputting terminal via a second power supply signal line, wherein a bias voltage is supplied to said semiconductor pressure sensor, wherein the plurality of semiconductor pressure sensors each comprise dopant ions.

A concentration of the dopant ions in the plurality of semiconductor pressure sensors is higher close to the bias voltage applying circuit than farther away from the bias voltage applying circuit, so that an electrical resistance value of the plurality of semiconductor pressure sensors is lower close to the bias voltage applying circuit than an electrical resistance value farther away from the bias voltage applying circuit.

In a second aspect, embodiments of the present disclosure further provide a display panel including the array substrate in the first aspect and a counter substrate oppositely disposed with the array substrate.

In a third aspect, embodiments of the present disclosure further provide a display device including the display panel in the second aspect.

In the array substrate, the display panel and the display device provided by embodiments of the present disclosure, the bias voltage applying circuit is electrically connected to the first power supply signal inputting terminal and the second power supply signal inputting terminal of the semiconductor pressure sensor via the first power supply signal line and the second power supply signal line, respectively. Moreover, a concentration of the dopant ions in the plurality of semiconductor pressure sensors is higher close to the bias voltage applying circuit than farther away from the bias voltage applying circuit, so that an electrical resistance value of the plurality of semiconductor pressure sensors is lower close to the bias voltage applying circuit than an electrical resistance value farther away from the bias voltage applying circuit, thereby ensuring that voltages received by semiconductor pressure sensors at positions with different distances from the bias voltage applying circuit are the same or similar, and hence improving the pressure detection sensitivity of the semiconductor pressure sensor.

BRIEF DESCRIPTION OF DRAWINGS

To describe technical solutions of exemplary embodiments of the present disclosure more clearly, accompanying drawings used for describing the embodiments are briefly presented below. Apparently, the presented accompanying drawings are merely accompanying drawings of a part of embodiments to be described in the disclosure rather than all accompanying drawings. For those skilled in the art, other accompanying drawings may be obtained based on these accompanying drawings without creative work.

DETAILED DESCRIPTION

Figure 1:
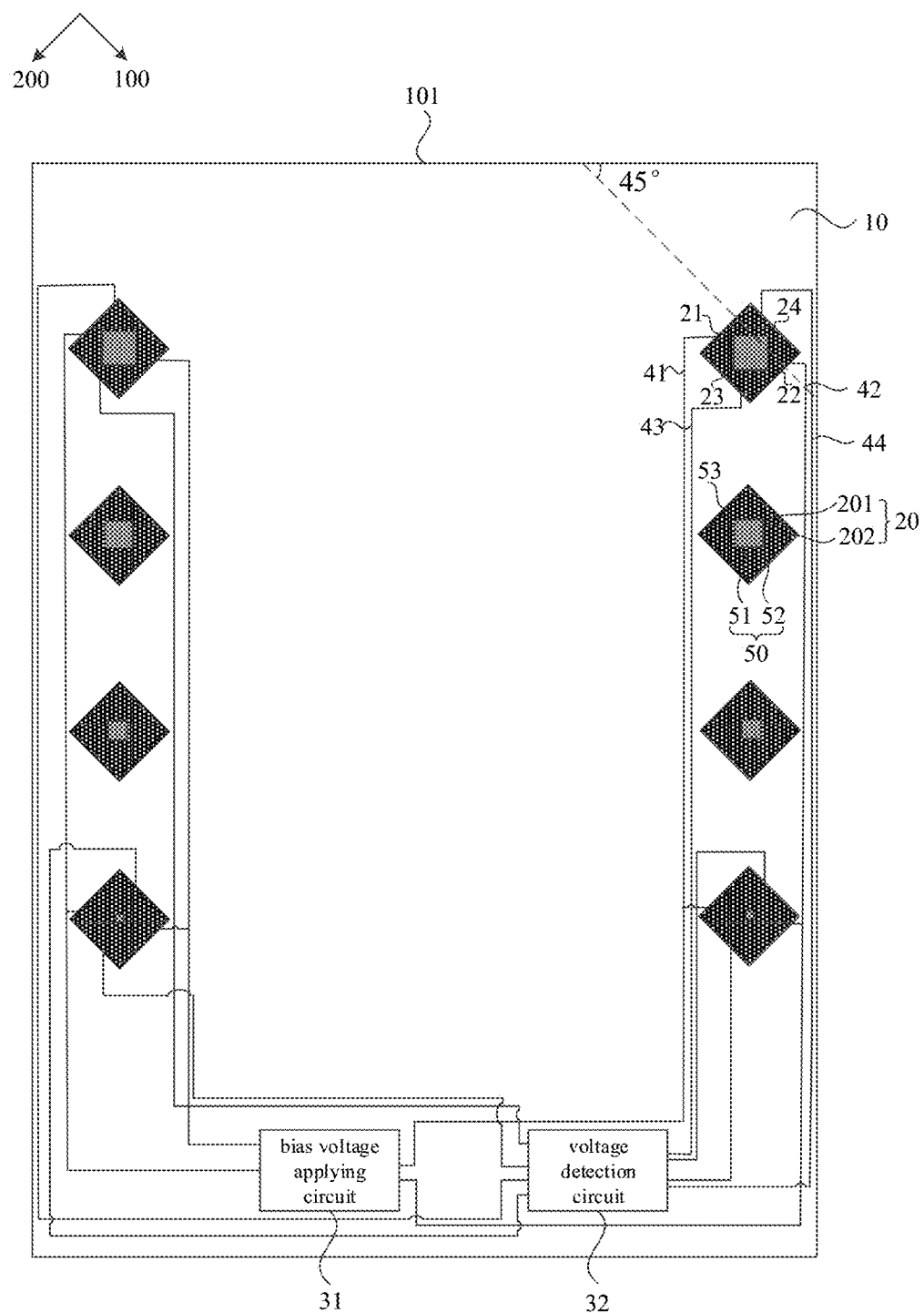
FIG. 1 is a structural schematic diagram of an array substrate provided by an embodiment of the present disclosure.

To make the objectives, technical solutions, and advantages of the present disclosure clearer, the technical solutions of the present disclosure will be fully described below through specific embodiments with reference to the accompanying drawings in the embodiments of the present disclosure. Apparently, the embodiments set forth below are a part of embodiments of the present disclosure rather than all embodiments. All other embodiments obtained by persons of ordinary skill in the art based on the embodiments of the present disclosure without creative efforts should fall within the protection scope of the present disclosure.

An embodiment of the present disclosure provides an array substrate. The array substrate includes a base substrate, and a bias voltage applying circuit and a plurality of semiconductor pressure sensors both disposed at a side of the base substrate. The bias voltage applying circuit is electrically connected to a first power supply signal inputting terminal of the semiconductor pressure sensor via a first power supply signal line. The bias voltage applying circuit is electrically connected to a second power supply signal inputting terminal of the semiconductor pressure sensor via a second power supply signal line. The bias voltage applying circuit is configured to supply a bias voltage to the semiconductor pressure sensor. A concentration of dopant ions of the semiconductor pressure sensor close to the bias voltage applying circuit is greater than a concentration of dopant ions of the semiconductor pressure sensor remote from the bias voltage applying circuit, so that a resistance value of the semiconductor pressure sensor close to the bias voltage applying circuit is less than a resistance value of the semiconductor pressure sensor remote from the bias voltage applying circuit. By configuring concentration of the dopant ions in the semiconductor pressure sensors according to position relationships with respect to the bias voltage applying circuit, the concentration of dopant ions of the semiconductor pressure sensor close to the bias voltage applying circuit may be set to be greater than the concentration of dopant ions of the semiconductor pressure sensor remote from the bias voltage applying circuit, so that the resistance value of the semiconductor pressure sensor close to the bias voltage applying circuit is less than the resistance value of the semiconductor pressure sensor remote from the bias voltage applying circuit. Therefore, voltages inputted to semiconductor pressure sensors at positions with different distances from the bias voltage applying circuit are the same or similar, thereby improving the pressure detection sensitivity of the semiconductor pressure sensor.

The foregoing is the core concept of the present disclosure. The technical solutions of the embodiments of the present disclosure will be described clearly and completely below with reference to the accompanying drawings in the embodiments of the present disclosure. All other embodiments obtained by persons of ordinary skill in the art based on the embodiments of the present disclosure without creative efforts should fall within the protection scope of the present disclosure.

FIG. 1 is a structural schematic diagram of an array substrate provided by an embodiment of the present disclosure. As shown in FIG. 1, the array substrate provided by the embodiment of the present disclosure includes a base substrate 10, a bias voltage applying circuit 31 and a plurality of semiconductor pressure sensors 20 disposed at a side of the base substrate 10.

The bias voltage applying circuit 31 is electrically connected to a first power supply signal inputting terminal 21 of the semiconductor pressure sensor 20 via a first power supply signal line 41. The bias voltage applying circuit 31 is electrically connected to a second power supply signal inputting terminal 22 of the semiconductor pressure sensor 20 via a second power supply signal line 42. The bias voltage applying circuit 31 is configured to supply a bias voltage to the semiconductor pressure sensor 20.

A concentration of dopant ions of the semiconductor pressure sensor 20 close to the bias voltage applying circuit 31 is greater than a concentration of dopant ions of the semiconductor pressure sensor 20 remote from the bias voltage applying circuit 31, so that a resistance value of the semiconductor pressure sensor 20 close to the bias voltage applying circuit 31 is less than a resistance value of the semiconductor pressure sensor 20 remote from the bias voltage applying circuit 31.

Exemplarily, the array substrate is provided with the plurality of semiconductor pressure sensors 20 and each semiconductor pressure sensor 20 needs to be electrically connected to the bias voltage applying circuit 31 to receive an input voltage. In this configuration, there are the semiconductor pressure sensor 20 close to the bias voltage applying circuit 31 and the semiconductor pressure sensor 20 remote from the bias voltage applying circuit 31, and hence the semiconductor pressure sensors 20 at different positions need second power supply signal lines 42 and first power supply signal lines 41 having different lengths to be connected to the bias voltage applying circuit 31. Since the first power supply signal line 41 and the second power supply signal line 42 have resistances, so that on the one hand, the resistances of the second power supply signal line 42 and first power supply signal line 41 corresponding to the semiconductor pressure sensor 20 close to the bias voltage applying circuit 31 are relatively small, and hence the voltage across such the power supply signal line is small; and on the other hand, the resistances of the second power supply signal line 42 and first power supply signal line 41 corresponding to the semiconductor pressure sensor 20 remote from the bias voltage applying circuit 31 are relatively large, and hence the voltage across such the power supply signal line is large. Therefore, when the resistances of the plurality of semiconductor pressure sensors 20 are the same to each other, the input voltage inputted to the semiconductor pressure sensor 20 close to the bias voltage applying circuit 31 is greater than the input voltage inputted to the semiconductor pressure sensor 20 remote from the bias voltage applying circuit 31, thereby causing unequal input voltages inputted to semiconductor pressure sensors 20 at different positions with different distances from the bias voltage applying circuit 31, and causing different detection voltage signals outputted by the semiconductor pressure sensors 20 at different positions of the display panel even when the pressures with the same magnitude are applied. As a result, the accuracy of the pressure detection is affected. Moreover, the input voltage received by the semiconductor pressure sensor 20 remote from the bias voltage applying circuit 31 is too small to perform the normal pressure detection. Therefore, in the array substrate provided by embodiments of the present disclosure, the semiconductor pressure sensors 20 are doped with ions. The larger the concentration of dopant ions is, the smaller the resistance of the semiconductor pressure sensor 20 is, so that the resistance values of the semiconductor pressure sensors 20 at different positions are adjusted by doping the semiconductor pressure sensors 20 at positions with different distances from the bias voltage applying circuit using different doses of ions. Thereby ensuring that the input voltages received by the semiconductor pressure sensors 20 at different positions are the same or similar, and even the semiconductor pressure sensor 20 having a larger distance from the bias voltage applying circuit 31 receives a larger input voltage. As a result, the sensitivity of the pressure detection is ensured. Specifically, the first power supply signal line 41 and the second power supply signal line 42 corresponding to the semiconductor pressure sensor 20 close to the bias voltage applying circuit 31 are relatively short, so that the voltages across the first power supply signal line 41 and the second power supply signal line 42 are small; also, the first power supply signal line 41 and the second power supply signal line 42 corresponding to the semiconductor pressure sensor 20 remote from the bias voltage applying circuit 31 are long, so that the voltages across the first power supply signal line 41 and the second power supply signal line 42 are large. Therefore, the concentration of dopant ions of the semiconductor pressure sensor 20 close to the bias voltage applying circuit 31 is greater than the concentration of dopant ions of the semiconductor pressure sensor 20 remote from the bias voltage applying circuit 31, thereby ensuring that the resistance value of the semiconductor pressure sensor 20 close to the bias voltage applying circuit 31 is less than the resistance value of the semiconductor pressure sensor 20 remote from the bias voltage applying circuit 31, and ensuring that input voltages received by semiconductor pressure sensors 20 at positions with different distances from the bias voltage applying circuit 31 are the same or similar, and hence improving the pressure detection sensitivity of the semiconductor pressure sensor 20. Moreover, the method of modifying the resistance values of the semiconductor pressure sensors by ion doping is simple and highly effective. It should be noted that, FIG. 1 just illustrates the first power supply signal line 41 and the second power supply signal line 42 corresponding to the semiconductor pressure sensor 20 nearest to the bias voltage applying circuit 31 and the first power supply signal line 41 and the second power supply signal line 42 corresponding to the semiconductor pressure sensor 20 farthest away from the bias voltage applying circuit 31, but the first power supply signal lines 41 and the second power supply signal lines 42 corresponding to the semiconductor pressure sensors 20 at other positions are not illustrated.

Optionally, dopant ions of the plurality of semiconductor pressure sensors 30 may be P-type ions or N-type ions. When the dopant ions are P-type ions, the dopant ions may be Boron ions. When the dopant ions are N-type ions, the dopant ions may be Phosphorus ions. The types and species of the dopant ions of the semiconductor pressure sensors 20 are not limited in the embodiments of the present disclosure, as long as the semiconductor pressure sensor 20 at positions with the different distances from the bias voltage applying circuit 31 have different resistances by being doped with different concentrations of dopant ions so that the input voltages received by semiconductor pressure sensors 20 at positions with different distances from the bias voltage applying circuit 31 are the same or similar.

Optionally, still referring to FIG. 1, the array substrate provided by embodiments of the present disclosure further includes a blocking pattern layer 50 disposed at a side of the semiconductor pressure sensors 20 away from the base substrate 10. An overlap region is present between a perpendicular projection of the blocking pattern layer 50 on the base substrate 10 and perpendicular projection of the semiconductor pressure sensor 20 on the base substrate 10. Optionally, the blocking pattern layer 50 may include blocking regions 51 and blocking-free regions 52. An area of the blocking-free region 52 of the blocking pattern layer 50 corresponding to the semiconductor pressure sensor 20 close to the bias voltage applying circuit 31 is greater than an area of the blocking-free region 52 of the blocking pattern layer 50 corresponding to the semiconductor pressure sensor 20 remote from the bias voltage applying circuit 31. By doping the plurality of semiconductor pressure sensors 20 with ions through the blocking-free regions 52, it is ensured that the concentration of dopant ions of the semiconductor pressure sensor 20 close to the bias voltage applying circuit 31 is greater than the concentration of dopant ions of the semiconductor pressure sensor 20 remote from the bias voltage applying circuit 31. FIG. 1 illustrates an example in which the perpendicular projection of the blocking pattern layer 50 on the base substrate 10 completely covers the perpendicular projection of the semiconductor pressure sensor 20 on the base substrate 10. However, in order to distinguish the boundary of the blocking pattern layer 50 and the boundary of the semiconductor pressure sensors 20, for the purpose of description, the perpendicular projection of the blocking pattern layer 50 on the base substrate 10 is depicted smaller than the perpendicular projection of the semiconductor pressure sensor 20 on the base substrate 10, and the boundary of the blocking pattern layer 50 is indicated by a dotted line 53, as shown in FIG. 1.

The semiconductor pressure sensors 20 are doped with ions through the blocking-free regions 52 of the blocking pattern layer 50. the concentration of dopant ions of the semiconductor pressure sensors 20 at different positions are different from each other by just arranging the different areas of blocking-free regions 52 corresponding to semiconductor pressure sensors 20 at positions with different distance from the bias voltage applying circuit 31, without the need to different concentrations or time period of dopant ions corresponding to different semiconductor pressure sensors 20, so that in the actual ion doping process, the ion doping process is simple and efficient, thereby ensuring the production process of the entire array substrate simple and efficient.

Figure 2:
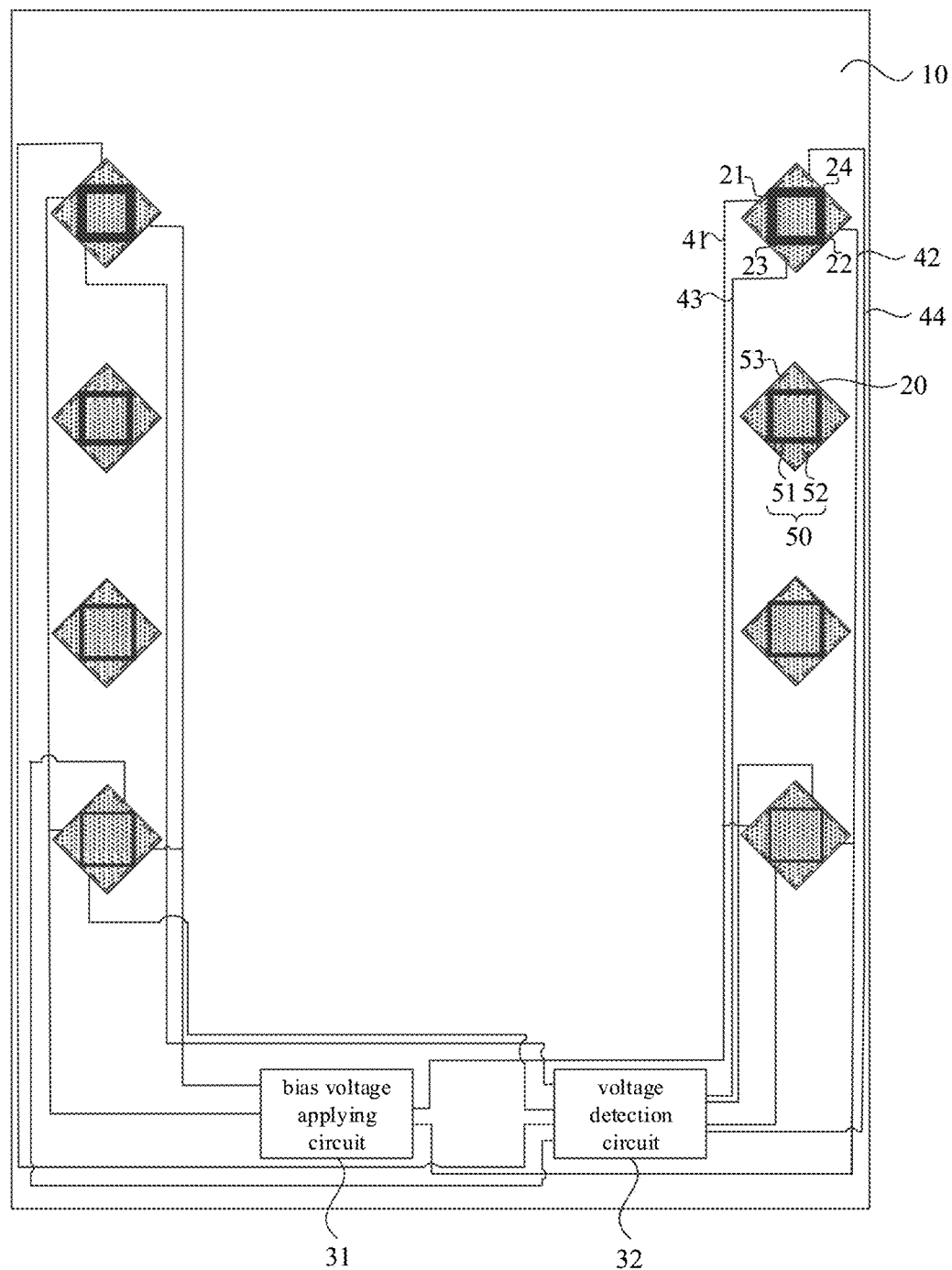
FIG. 2 is a structural schematic diagram of another array substrate provided by an embodiment of the present disclosure.

It should be noted that, before the semiconductor pressure sensor 20 is doped with ions through the blocking-free region 52, a doping concentration of the semiconductor pressure sensor 20 may be zero, or may not be zero, which is not limited in the embodiments of the present disclosure. However, when the semiconductor pressure sensor 20 is divided into several disconnected and independent regions by the perpendicular projection of the blocking region 50 on a plane of the semiconductor pressure sensor 20, the doping concentration of the semiconductor pressure sensor 20 cannot be zero before doping the semiconductor pressure sensor 20 with ions through the blocking-free region 52, as shown in FIG. 2. Since the semiconductor pressure sensor 20 is divided into several disconnected and independent regions by the perpendicular projection of the blocking region 50 on the plane of the semiconductor pressure sensor 20, a region of the semiconductor pressure sensor 20 corresponding to the blocking region 51 is not doped in the ion doping process and the doping concentration thereof is zero. Therefore, the semiconductor pressure sensor 20 as a whole is at a non-conducting state, signals cannot be transmitted via the semiconductor pressure sensor 20, and hence the pressure detection cannot be carried out. For ensuring the normal operation of the semiconductor pressure sensor 20 and normal operation of the pressure detection, the doping concentration of the semiconductor pressure sensor 20 cannot be zero before doping the semiconductor pressure sensor 20 with ions through the blocking-free region 52, when the semiconductor pressure sensor 20 is divided into several disconnected and independent regions by the perpendicular projection of the blocking region 50 on the plane of the semiconductor pressure sensor 20.

Figure 3:
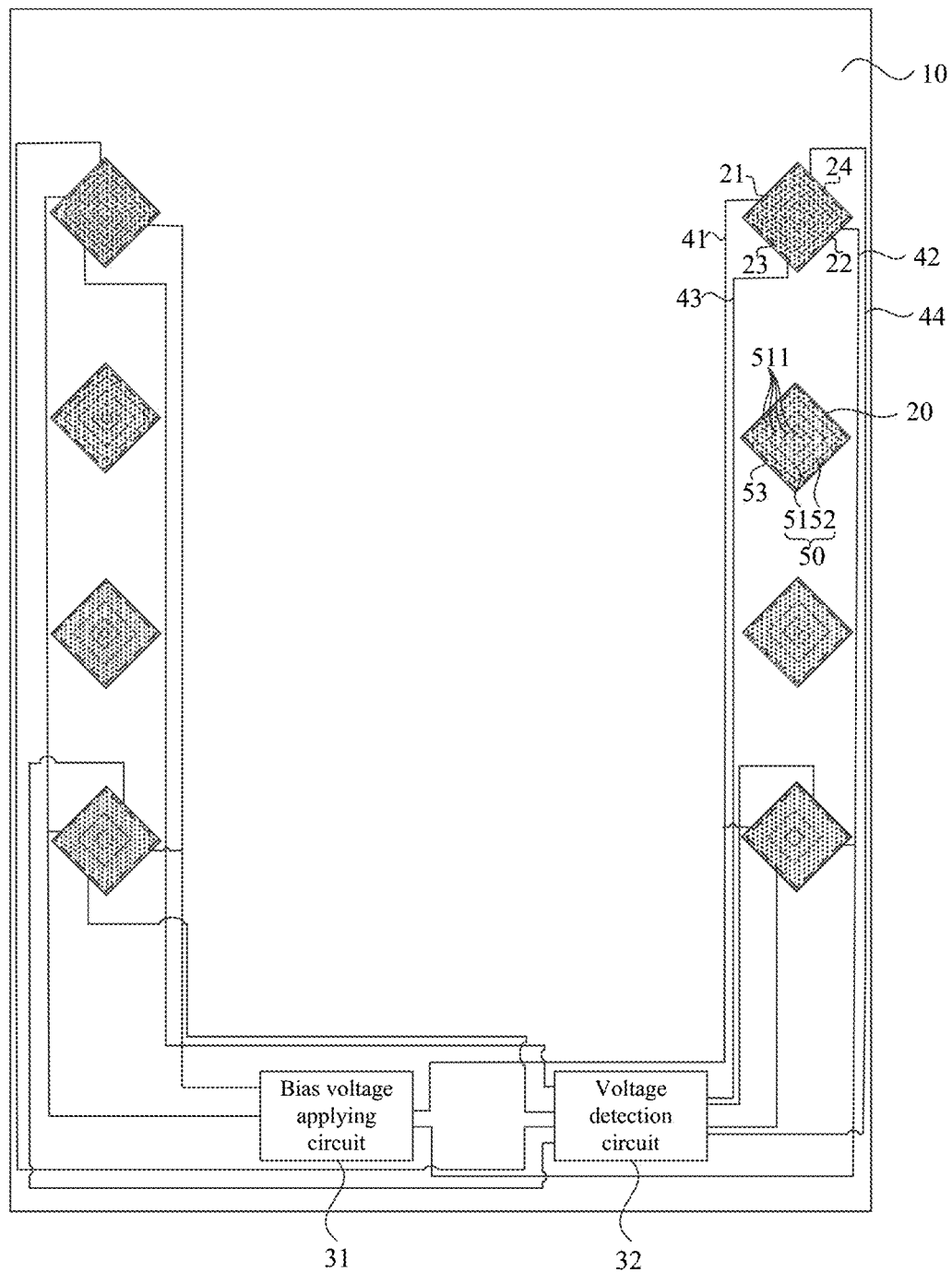
FIG. 3 is a structural schematic diagram of another array substrate provided by an embodiment of the present disclosure.
Figure 6:
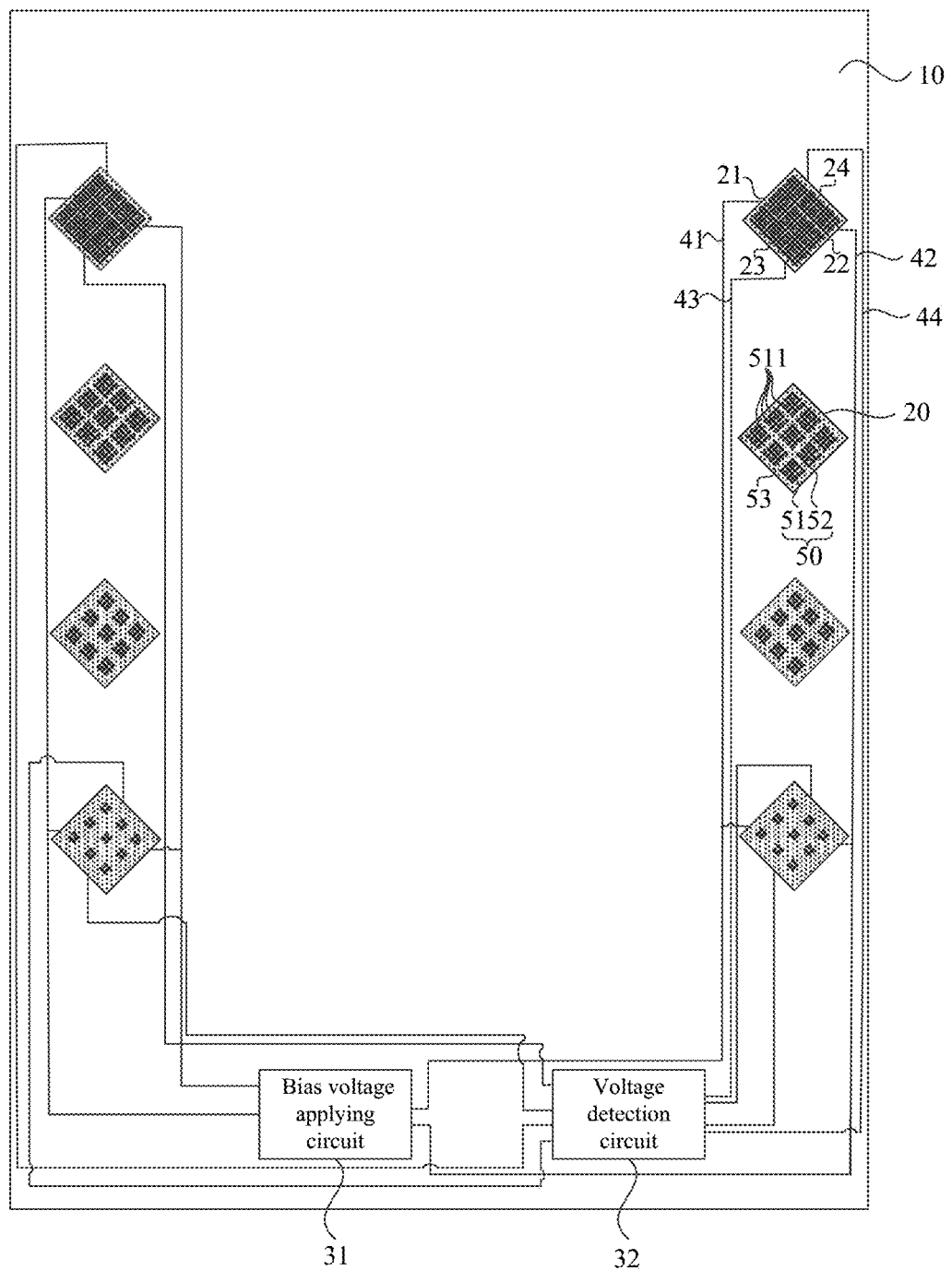
FIG. 6 is a structural schematic diagram of another array substrate provided by an embodiment of the present disclosure.
Figure 9:
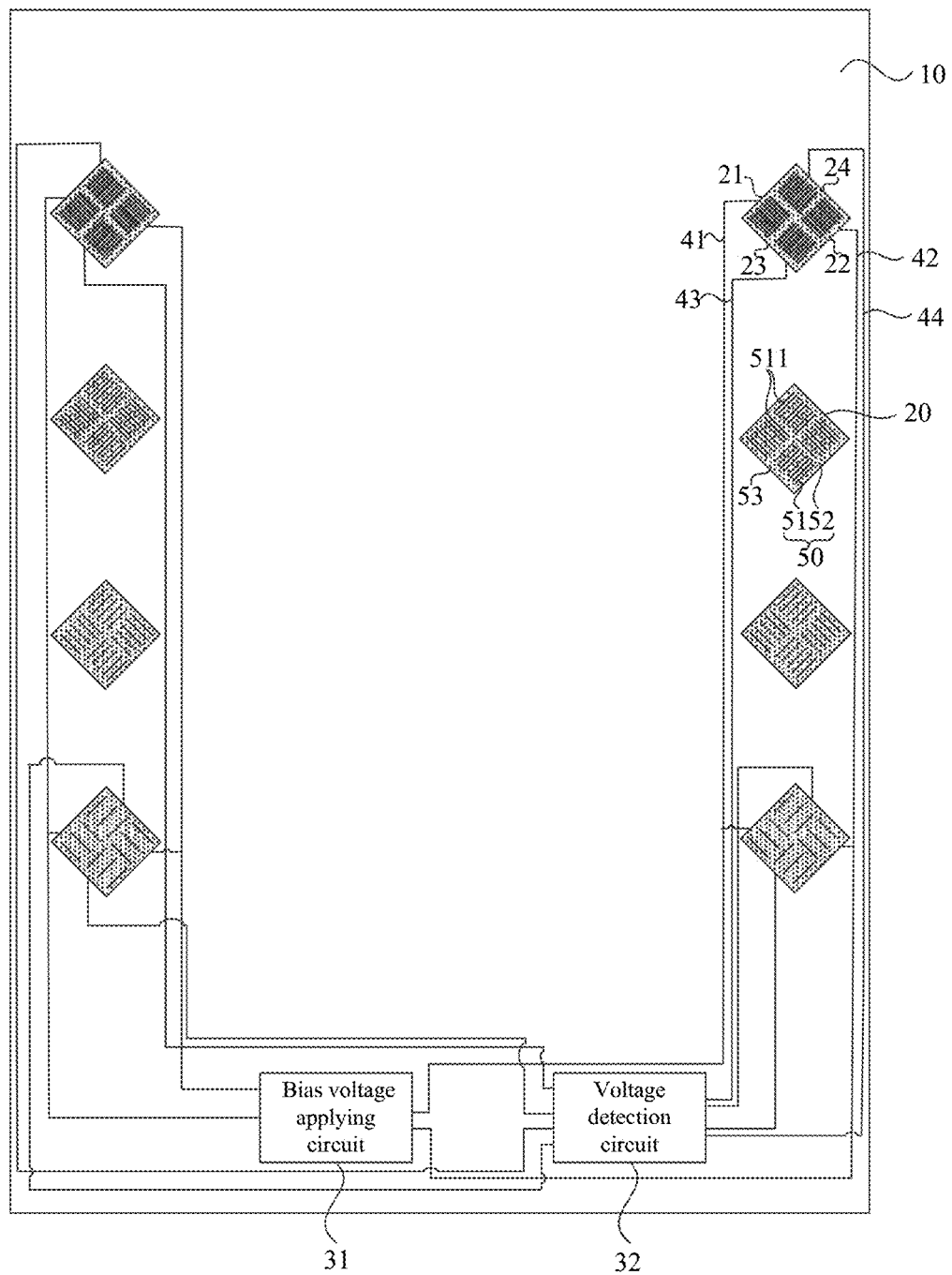
FIG. 9 is a structural schematic diagram of another array substrate provided by an embodiment of the present disclosure.
Figure 12:
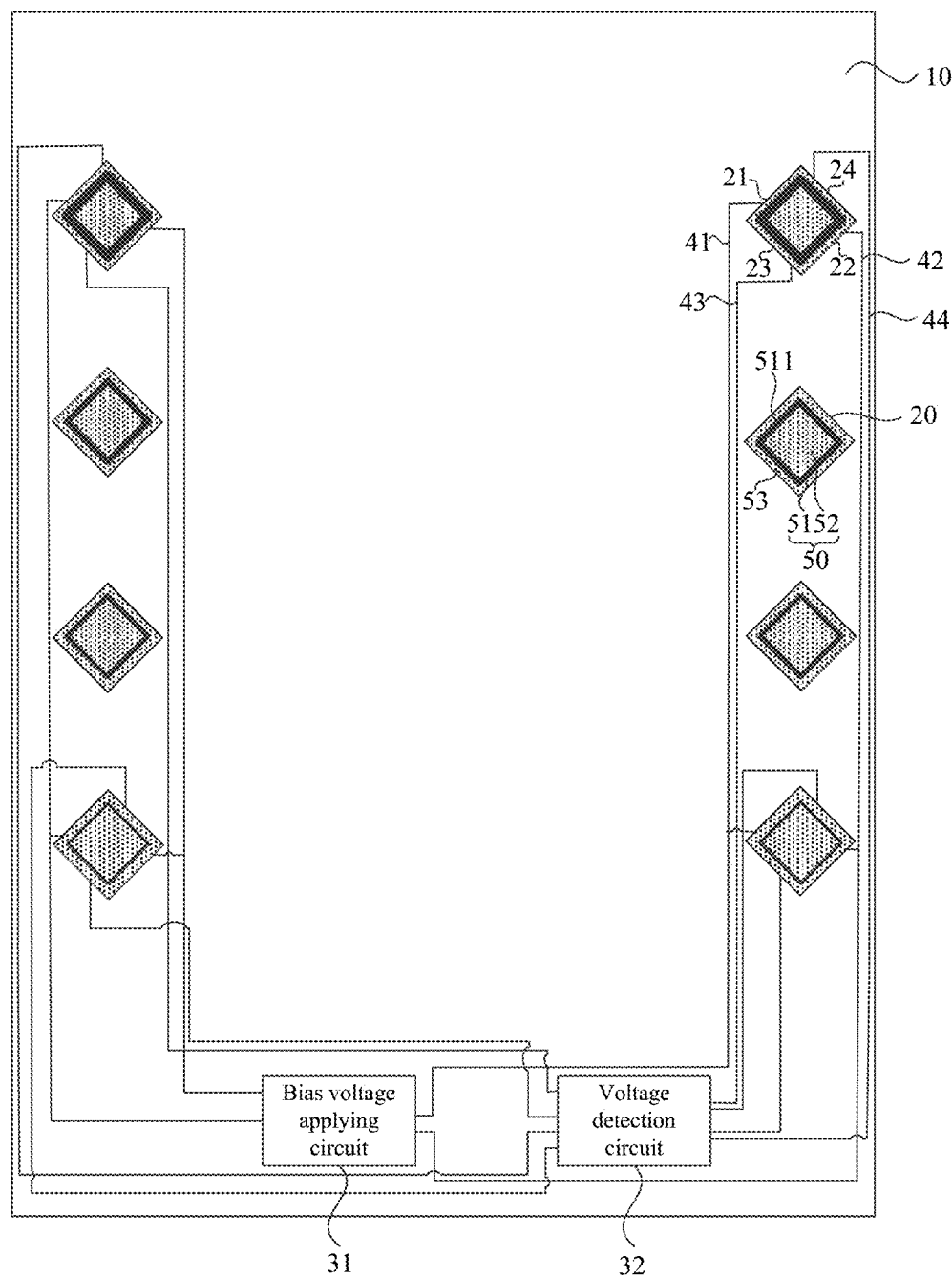
FIG. 12 is a structural schematic diagram of another array substrate provided by an embodiment of the present disclosure.
Figure 13:
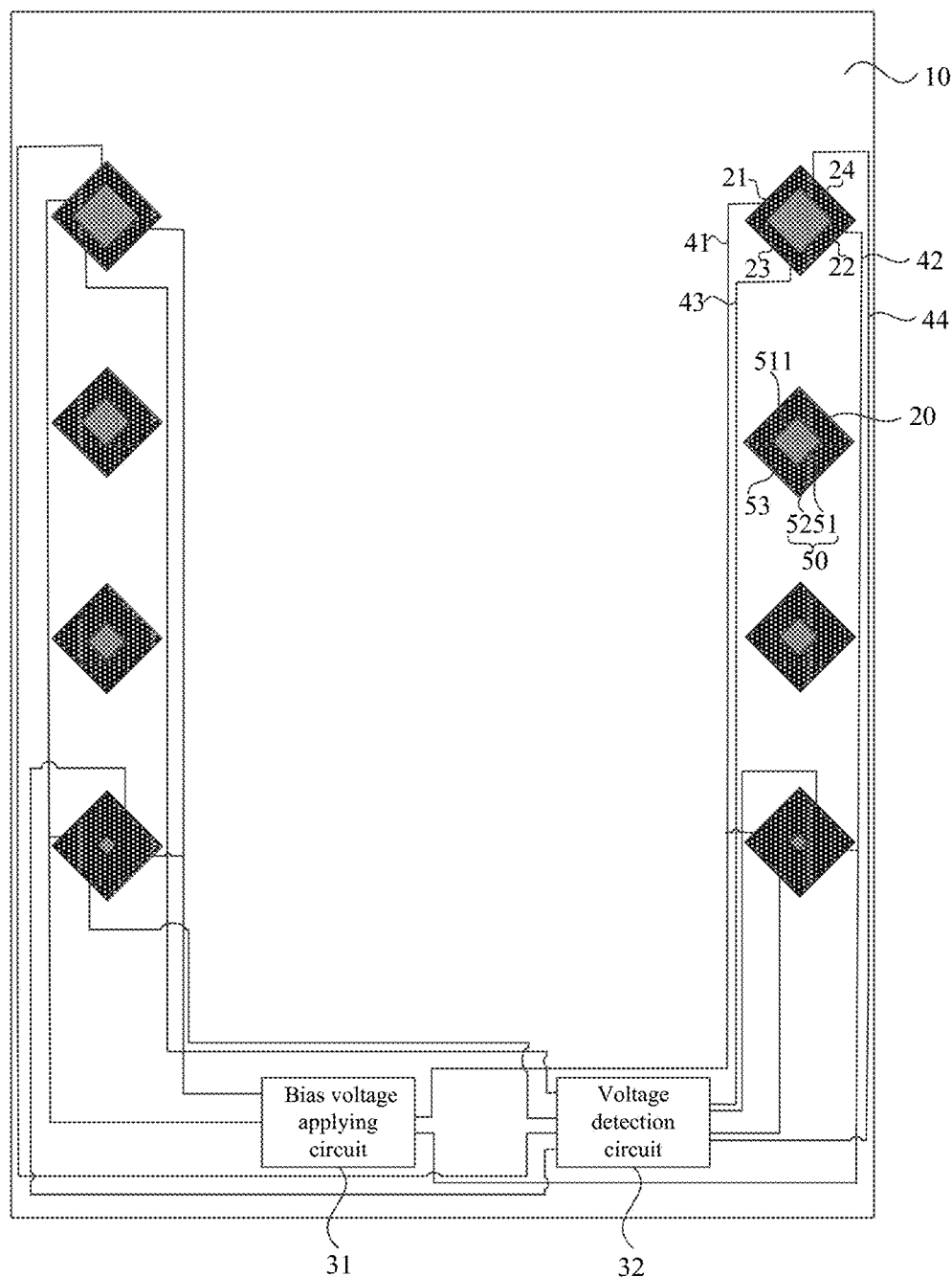
FIG. 13 is a structural schematic diagram of another array substrate provided by an embodiment of the present disclosure.
Figure 14:
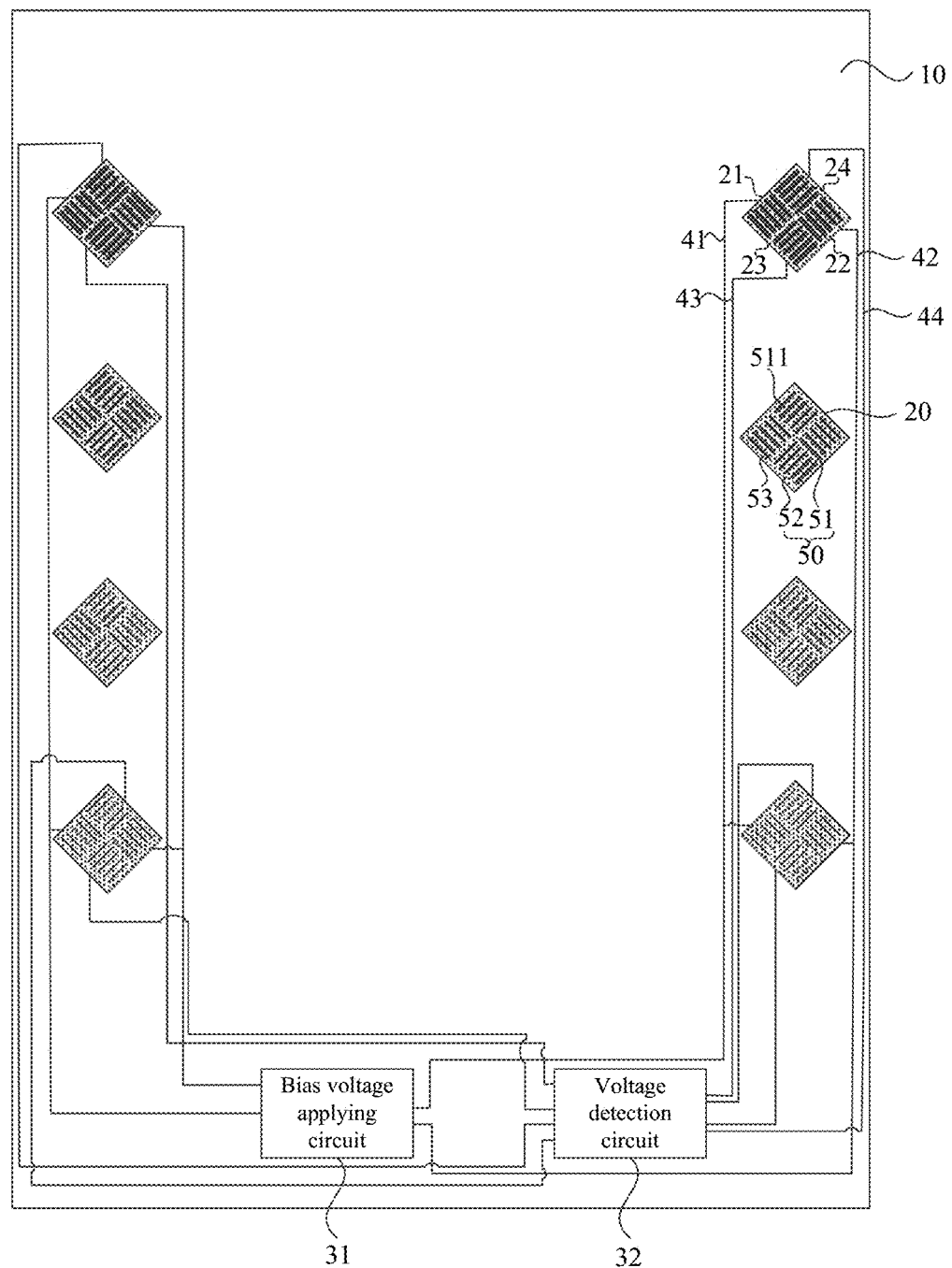
FIG. 14 is a structural schematic diagram of another array substrate provided by an embodiment of the present disclosure.

Optionally, as shown in FIGS. 3, 6, 9 and 12 to 14, the blocking region 51 of the blocking pattern layer 50 includes blocking patterns 511. By arranging the different distribution densities and/or blocking areas to the blocking patterns 511 corresponding to semiconductor pressure sensors 20 at positions with different distances from the bias voltage applying circuit 31, it can ensure that the concentrations of dopant ions of the semiconductor pressure sensors 20 at positions with different distances from the bias voltage applying circuit 31 are different, and also it can ensure that the resistance values of the semiconductor pressure sensors 20 at positions with different distances from the bias voltage applying circuit 31 are different. Specifically, the distribution density of the blocking patterns 511 of the blocking pattern layer 50 corresponding to the semiconductor pressure sensor 20 close to the bias voltage applying circuit 31 is arranged to be less than the distribution density of the blocking patterns 511 of the blocking pattern layer 50 corresponding to the semiconductor pressure sensor 20 remote from the bias voltage applying circuit 31; and/or, the blocking area of the blocking patterns 511 of the blocking pattern layer 50 corresponding to the semiconductor pressure sensor 20 close to the bias voltage applying circuit 31 is arranged to be less than the blocking area of the blocking patterns 511 of the blocking pattern layer 50 corresponding to the semiconductor pressure sensor 20 remote from the bias voltage applying circuit 31. Exemplarily, FIGS. 3, 6 and 9 illustrate, through three kinds of specific blocking patterns 511, a configuration in which the distribution density of the blocking patterns 511 of the blocking pattern layer 50 corresponding to the semiconductor pressure sensor 20 close to the bias voltage applying circuit 31 is less than the distribution density of the blocking patterns 511 of the blocking pattern layer 50 corresponding to the semiconductor pressure sensor 20 remote from the bias voltage applying circuit 31. FIGS. 12, 13 and 14 illustrate, through three kinds of specific blocking patterns 511, a configuration in which the blocking area of the blocking patterns 511 of the blocking pattern layer 50 corresponding to the semiconductor pressure sensor 20 close to the bias voltage applying circuit 31 is less than the blocking area of the blocking patterns 511 of the blocking pattern layer 50 corresponding to the semiconductor pressure sensor 20 remote from the bias voltage applying circuit 31.

Figure 4:
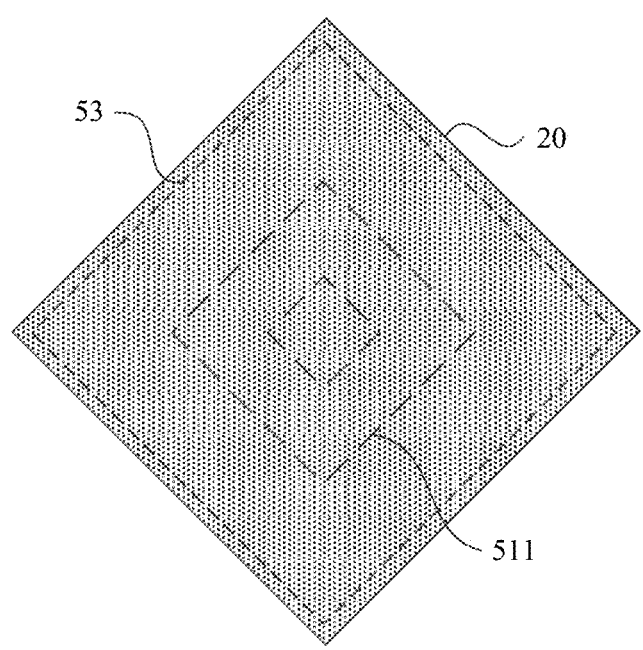
FIG. 4 is an enlarged schematic diagram of a semiconductor strain sensor close to a bias voltage applying circuit and a blocking pattern.
Figure 5:
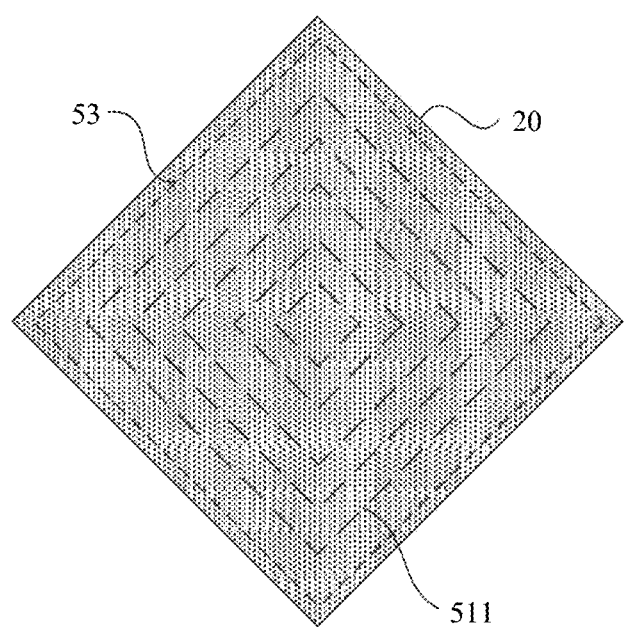
FIG. 5 is an enlarged schematic diagram of a semiconductor strain sensor remote from the bias voltage applying circuit and a blocking pattern.

FIG. 3 is a structural schematic diagram of another array substrate provided by an embodiment of the present disclosure. FIG. 4 is an enlarged schematic diagram of a semiconductor strain sensor close to a bias voltage applying circuit and a blocking pattern. FIG. 5 is an enlarged schematic diagram of a semiconductor strain sensor remote from the bias voltage applying circuit and a blocking pattern. As shown in FIGS. 3 to 5, the blocking patterns 511 are a plurality of square patterns having same shapes as and concentric with the corresponding semiconductor pressure sensor 20. Each of the plurality of square patterns is composed of a plurality of discontinuous dot-shaped patterns. The dot-shaped pattern may be a square shape, round shape and stripe shape, etc. An interval between adjacent two of square patterns corresponding to a same semiconductor pressure sensor is equal. An interval between adjacent two of the square patterns corresponding to the semiconductor pressure sensor 20 close to the bias voltage applying circuit 31 is greater than an interval between adjacent two of the square patterns corresponding to the semiconductor pressure sensor 20 remote from the bias voltage applying circuit 31. By arranging the interval between adjacent two of the square patterns corresponding to the semiconductor pressure sensor 20 close to the bias voltage applying circuit 31 to be greater than the interval between adjacent two of the square patterns corresponding to the semiconductor pressure sensor 20 remote from the bias voltage applying circuit 31, the distribution density of the blocking patterns 511 corresponding to the semiconductor pressure sensor 20 close to the bias voltage applying circuit 31 is small; and hence the area of the blocking-free region thereof is large, so that the concentration of dopant ions is large when the semiconductor pressure sensor 20 is doped with ions through the blocking-free regions, thus ensuring the small resistance of the semiconductor pressure sensor 20 close to the bias voltage applying circuit 31. It should be noted that the specific shapes of the dot-shaped patterns are not limited in embodiments of the present disclosure.

Figure 7:
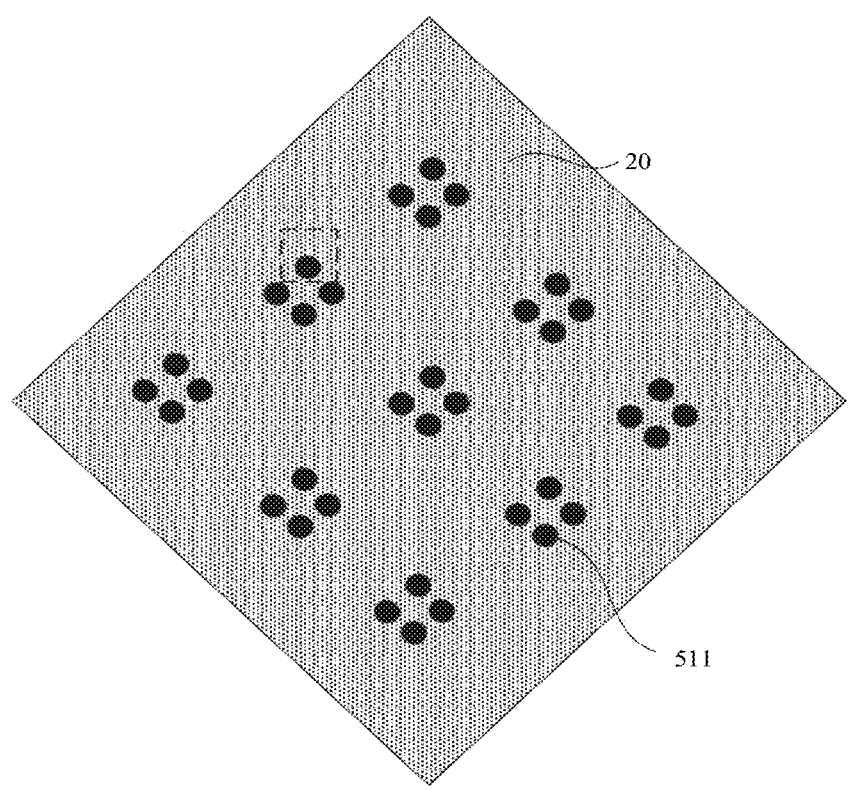
FIG. 7 is an enlarged schematic diagram of a semiconductor strain sensor close to a bias voltage applying circuit and a blocking pattern.
Figure 8:
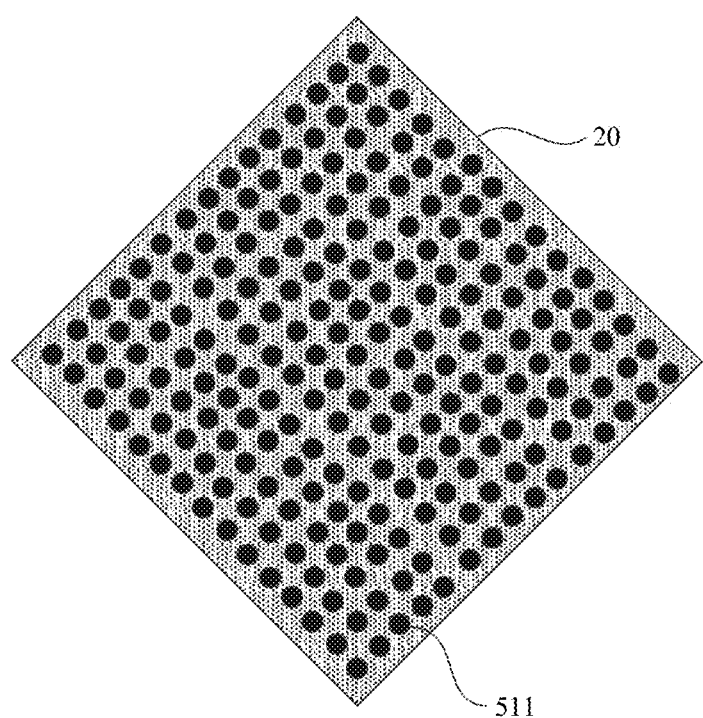
FIG. 8 is an enlarged schematic diagram of a semiconductor strain sensor remote from the bias voltage applying circuit and a blocking pattern.

FIG. 6 is a structural schematic diagram of another array substrate provided by an embodiment of the present disclosure. FIG. 7 is an enlarged schematic diagram of a semiconductor strain sensor close to a bias voltage applying circuit and a blocking pattern. FIG. 8 is an enlarged schematic diagram of a semiconductor strain sensor remote from the bias voltage applying circuit and a blocking pattern. As shown in FIGS. 6 to 8, the blocking patterns 511 are a plurality of dot-shaped patterns arranged in arrays. Perpendicular projections of the dot-shaped patterns on the base substrate 10 are uniformly distributed in the perpendicular projection of the corresponding semiconductor pressure sensor 20 on the base substrate 10. The number of dot-shaped patterns (a pattern in a dotted line in FIG. 7) corresponding to the semiconductor pressure sensor 20 close to the bias voltage applying circuit 31 is less than the number of dot-shaped patterns corresponding to the semiconductor pressure sensor 20 remote from the bias voltage applying circuit 31. By arranging the number of dot-shaped patterns corresponding to the semiconductor pressure sensor 20 close to the bias voltage applying circuit 31 to be less than the number of dot-shaped patterns corresponding to the semiconductor pressure sensor 20 remote from the bias voltage applying circuit 31, the distribution density of the blocking patterns 511 corresponding to the semiconductor pressure sensor 20 close to the bias voltage applying circuit 31 is small, and hence the area of the blocking-free region thereof is large, so that the concentration of dopant ions is large when the semiconductor pressure sensor 20 is doped with ions through the blocking-free regions, thus ensuring the small resistance of the semiconductor pressure sensor 20 close to the bias voltage applying circuit 31.

Figure 10:
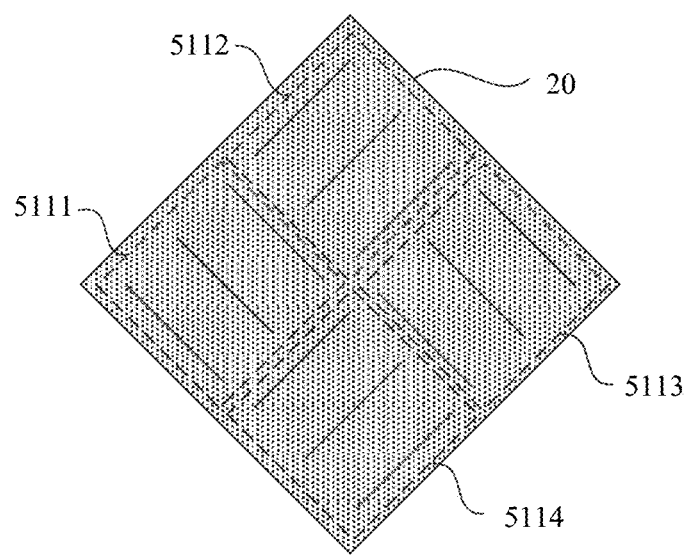
FIG. 10 is an enlarged schematic diagram of a semiconductor strain sensor close to a bias voltage applying circuit and a blocking pattern.
Figure 11:
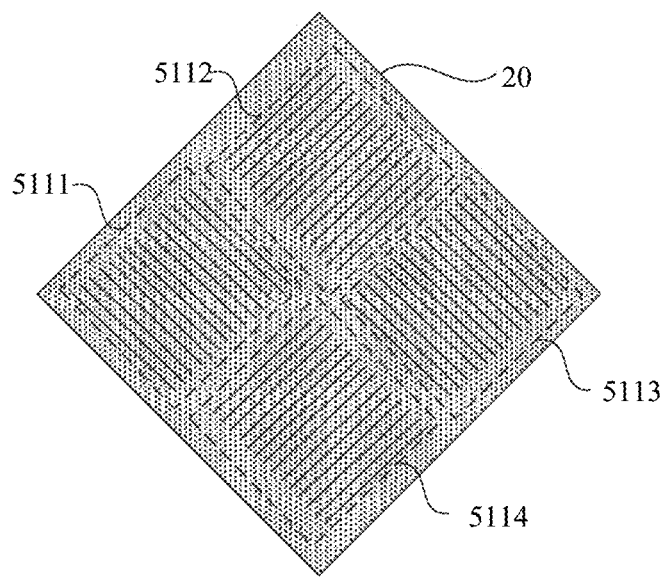
FIG. 11 is an enlarged schematic diagram of a semiconductor strain sensor remote from the bias voltage applying circuit and a blocking pattern.

FIG. 9 is a structural schematic diagram of another array substrate provided by an embodiment of the present disclosure. FIG. 10 is an enlarged schematic diagram of a semiconductor strain sensor close to a bias voltage applying circuit and a blocking pattern. FIG. 11 is an enlarged schematic diagram of a semiconductor strain sensor remote from the bias voltage applying circuit and a blocking pattern. As shown in FIGS. 9 to 11, the blocking pattern 511 includes a first blocking pattern 5111, a second blocking pattern 5112, a third blocking pattern 5113 and a fourth blocking pattern 5114. Perpendicular projections of the first blocking pattern 5111, the second blocking pattern 5112, the third blocking pattern 5113 and the fourth blocking pattern 5114 on the base substrate 10 are uniformly distributed in the perpendicular projection of the corresponding semiconductor pressure sensor 20 on the base substrate 10. Each of the first blocking pattern 5111, the second blocking pattern 5112, the third blocking pattern 5113 and the fourth blocking pattern 5114 includes a plurality of parallel striped patterns. Extension directions of striped patterns of adjacent two of the first blocking pattern, the second blocking pattern, the third blocking pattern and the fourth blocking pattern are perpendicular to each other. In each of the blocking patterns 511, the number of the striped patterns in the blocking pattern 511 corresponding to the semiconductor pressure sensor 20 close to the bias voltage applying circuit 31 is less than the number of the striped patterns in the blocking pattern 511 corresponding to the semiconductor pressure sensor 20 remote from the bias voltage applying circuit 31. By arranging the number of the striped patterns in the blocking pattern 511 corresponding to the semiconductor pressure sensor 20 close to the bias voltage applying circuit 31 to be less than the number of the striped patterns in the blocking pattern 511 corresponding to the semiconductor pressure sensor 20 remote from the bias voltage applying circuit 31, the distribution density of the blocking patterns 511 corresponding to the semiconductor pressure sensor 20 close to the bias voltage applying circuit 31 is small, and hence the area of the blocking-free region thereof is large, so that the concentration of dopant ions is large when the semiconductor pressure sensor 20 is doped with ions through the blocking-free regions, thus ensuring the small resistance of the semiconductor pressure sensor 20 close to the bias voltage applying circuit 31.

FIG. 12 is a structural schematic diagram of another array substrate provided by an embodiment of the present disclosure. As shown in FIG. 12, the blocking patterns 511 are square patterns having same shapes as the semiconductor pressure sensors 20. Each of the square patterns is composed of a plurality of striped patterns connected end to end and parallel to corresponding edges of the corresponding semiconductor pressure sensor 20. A perpendicular projection of the square pattern on the base substrate 10 is within the perpendicular projection of corresponding semiconductor pressure sensor 20 on the base substrate 10, and a center of the perpendicular projection of the square pattern on the base substrate 10 is coincided with a center of the perpendicular projection of the corresponding semiconductor pressure sensor 20 on the base substrate 10. A width of each of the plurality of striped patterns of the square pattern corresponding to the semiconductor pressure sensor 20 close to the bias voltage applying circuit 31 is less than a width of each of the plurality of striped patterns of the square pattern corresponding to the semiconductor pressure sensor 20 remote from the bias voltage applying circuit 31. By arranging the width of the striped pattern of the square pattern corresponding to the semiconductor pressure sensor 20 close to the bias voltage applying circuit 31 to be less than the width of the striped pattern of the square pattern corresponding to the semiconductor pressure sensor 20 remote from the bias voltage applying circuit 31, the blocking area of the blocking pattern 511 corresponding to the semiconductor pressure sensor 20 close to the bias voltage applying circuit 31 is small, and hence the area of the blocking-free region thereof is large, so that the concentration of dopant ions is large when the semiconductor pressure sensor 20 is doped with ions through the blocking-free regions, thus ensuring the small resistance of the semiconductor pressure sensor 20 close to the bias voltage applying circuit 31.

FIG. 13 is a structural schematic diagram of another array substrate provided by an embodiment of the present disclosure. As shown in FIG. 13, the blocking patterns 511 are block patterns having same shapes as the semiconductor pressure sensors 20. A perpendicular projection of the block pattern on the base substrate 10 is at a central position of the perpendicular projection of the semiconductor pressure sensor 20 on the base substrate 10. An area of the block pattern corresponding to the semiconductor pressure sensor 20 close to the bias voltage applying circuit 31 is less than an area of the block pattern corresponding to the semiconductor pressure sensor 20 remote from the bias voltage applying circuit 31. By arranging the area of the block pattern corresponding to the semiconductor pressure sensor 20 close to the bias voltage applying circuit 31 to be less than the area of the block pattern corresponding to the semiconductor pressure sensor 20 remote from the bias voltage applying circuit 31, the blocking area of the blocking pattern 511 corresponding to the semiconductor pressure sensor 20 close to the bias voltage applying circuit 31 is small, and hence the area of the blocking-free region thereof is large, so that the concentration of dopant ions is large when the semiconductor pressure sensor 20 is doped with ions through the blocking-free regions, thus ensuring the small resistance of the semiconductor pressure sensor 20 close to the bias voltage applying circuit 31.

Figure 15:
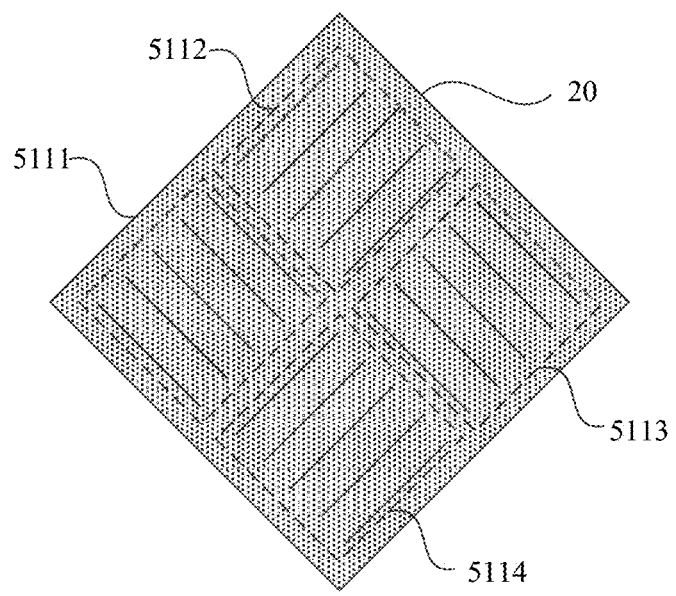
FIG. 15 is an enlarged schematic diagram of a semiconductor strain sensor close to a bias voltage applying circuit and a blocking pattern.
Figure 16:
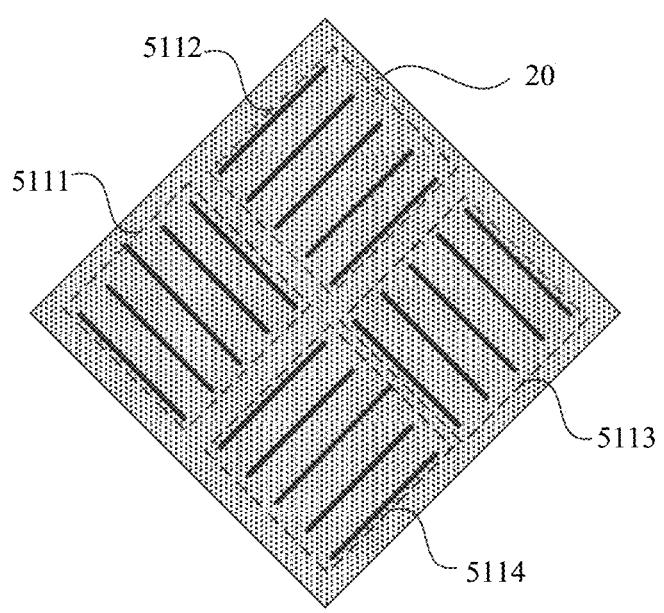
FIG. 16 is an enlarged schematic diagram of a semiconductor strain sensor remote from the bias voltage applying circuit and a blocking pattern.

FIG. 14 is a structural schematic diagram of another array substrate provided by an embodiment of the present disclosure. FIG. 15 is an enlarged schematic diagram of a semiconductor strain sensor close to a bias voltage applying circuit and a blocking pattern. FIG. 16 is an enlarged schematic diagram of a semiconductor strain sensor remote from the bias voltage applying circuit and a blocking pattern. As shown in FIGS. 14 to 16, the blocking pattern 511 includes a first blocking pattern 5111, a second blocking pattern 5112, a third blocking pattern 5113 and a fourth blocking pattern 5114. Perpendicular projections of the first blocking pattern 5111, the second blocking pattern 5112, the third blocking pattern 5113 and the fourth blocking pattern 5114 on the base substrate 10 are uniformly distributed in the perpendicular projection of the semiconductor pressure sensor 20 on the base substrate 10. Each of the first blocking pattern 5111, the second blocking pattern 5112, the third blocking pattern 5113 and the fourth blocking pattern 5114 includes a plurality of parallel striped patterns. Extension directions of striped patterns of adjacent two of the first blocking pattern, the second blocking pattern, the third blocking pattern and the fourth blocking pattern are perpendicular to each other. In each of the blocking patterns 511, the area of the striped patterns in the blocking pattern 511 corresponding to the semiconductor pressure sensor 20 close to the bias voltage applying circuit 31 is less than the area of the striped patterns in the blocking pattern 511 corresponding to the semiconductor pressure sensor 20 remote from the bias voltage applying circuit 31. By arranging the area of the striped patterns in the blocking pattern 511 corresponding to the semiconductor pressure sensor 20 close to the bias voltage applying circuit 31 to be less than the area of the striped patterns in the blocking pattern 511 corresponding to the semiconductor pressure sensor 20 remote from the bias voltage applying circuit 31, the blocking area of the blocking pattern 511 corresponding to the semiconductor pressure sensor 20 close to the bias voltage applying circuit 31 is small, and hence the area of the blocking-free region thereof is large, so that the concentration of dopant ions is large when the semiconductor pressure sensor 20 is doped with ions through the blocking-free regions, thus ensuring the small resistance of the semiconductor pressure sensor 20 close to the bias voltage applying circuit 31.

It should be noted that, the blocking pattern 511 shown in FIG. 3 includes concentric square patterns composed of a plurality of discontinuous dot-shaped patterns. The dot-shaped pattern may include a hole. The blocking pattern 511 shown in FIG. 6 includes a plurality of dot-shaped patterns arranged in arrays. Each of the first blocking pattern 5111, the second blocking pattern 5112, the third blocking pattern 5113 and the fourth blocking pattern 5114 in the blocking pattern 511 shown in FIGS. 9 and 14 includes a plurality of parallel striped patterns and perpendicular projections of the striped patterns on the base substrate 10 are uniformly distributed in the perpendicular projection of the corresponding semiconductor pressure sensor 20 on the base substrate 10; and the blocking pattern 511 shown in FIG. 13 is a block pattern having a same shape as the semiconductor pressure sensor 20 and the perpendicular projection of the block pattern on the base substrate 10 is located at the central position of the perpendicular projection of the corresponding semiconductor pressure sensor 20 on the base substrate 10. With reference to FIGS. 3, 6, 9, 13 and 14, the semiconductor pressure sensor 20 is not divided into several disconnected and independent regions by the perpendicular projection of the blocking pattern 511 on the plane of the semiconductor pressure sensor 20. Therefore, in the array substrate shown in FIGS. 3, 6, 9, 13 and 14, the concentration of dopant ions of the semiconductor pressure sensor 20 before the semiconductor pressure sensor 20 is doped with ion may be zero or may not be zero. The concentration of dopant ions of the semiconductor pressure sensor 20 before the semiconductor pressure sensor 20 is doped with ion is not limited herein. The blocking pattern 511 shown in FIG. 12 is a closed square pattern having the same shape as the semiconductor pressure sensor 20, and the semiconductor pressure sensor 20 is divided into several disconnected and independent regions by the perpendicular projection of the blocking pattern 511 on the plane of the semiconductor pressure sensor 20. It should be noted that, in the array substrate shown in FIG. 12, the concentration of dopant ions of the semiconductor pressure sensor 20 cannot be zero before the semiconductor pressure sensor 20 is doped with ion, in order for preventing the semiconductor pressure sensor 20 as a whole from being at a non-conducting state, otherwise, signals cannot be transmitted via the semiconductor pressure sensor 20, and the pressure detection cannot be performed.

Optionally, still referring to FIG. 1, the semiconductor pressure sensor 20 includes a first region 201 and a second region 202. There is an overlap region between a perpendicular projection of the first region 201 on the base substrate 10 and the perpendicular projection of the blocking region 51 on the base substrate 10, and there is an overlap region between a perpendicular projection of the second region 202 on the base substrate 10 and the perpendicular projection of the blocking-free region 52 on the base substrate 10. The first power supply signal line 41 and the second power supply signal line 42 are both electrically connected to the second region 202 overlapping the blocking-free region 52. It should be noted that, as shown in the top view of FIG. 1, the first region 201 of the semiconductor pressure sensor completely corresponds to the blocking region 51 in the blocking pattern layer 50, and the second region 202 of the semiconductor pressure sensor completely corresponds to the blocking-free region 52 in the blocking pattern layer 50. It is clear here that 201 and 202 denote the first region and the second region of the semiconductor pressure sensor 20, respectively, and 51 and 52 denote the blocking region and the blocking-free region of the blocking pattern layer 50, respectively. The ion doping is performed on the semiconductor pressure sensor 20 through the blocking-free region 52, so that the concentration of dopant ions of the second region 202 corresponding to the non-blocking region 52 is greater than that of the first region 201 corresponding to the blocking region 51, and hence the concentration of dopant ions of the second region 202 is higher and also a region with a higher concentration of dopant ions has a smaller resistance. When the first power supply signal line 41 and the second power supply signal line 42 are electrically connected to the second region 202, it is ensured that an ohmic contact is formed between the second region 202 and each of the first power supply signal line 41 and the second power supply signal line 42, thereby reducing a contact resistance between a metal signal wire and a semiconductor layer, and further ensuring that the semiconductor pressure sensor 20 obtains a large voltage. Furthermore, it is ensured that the semiconductor pressure sensor 20 has a greater sensitivity during pressure detection, and the energy loss caused by a large contact resistance between the metal signal wire and the semiconductor layer can be reduced, thereby improving an energy utilizing efficiency of the array substrate, saving energy and protecting the environment.

Figure 17:
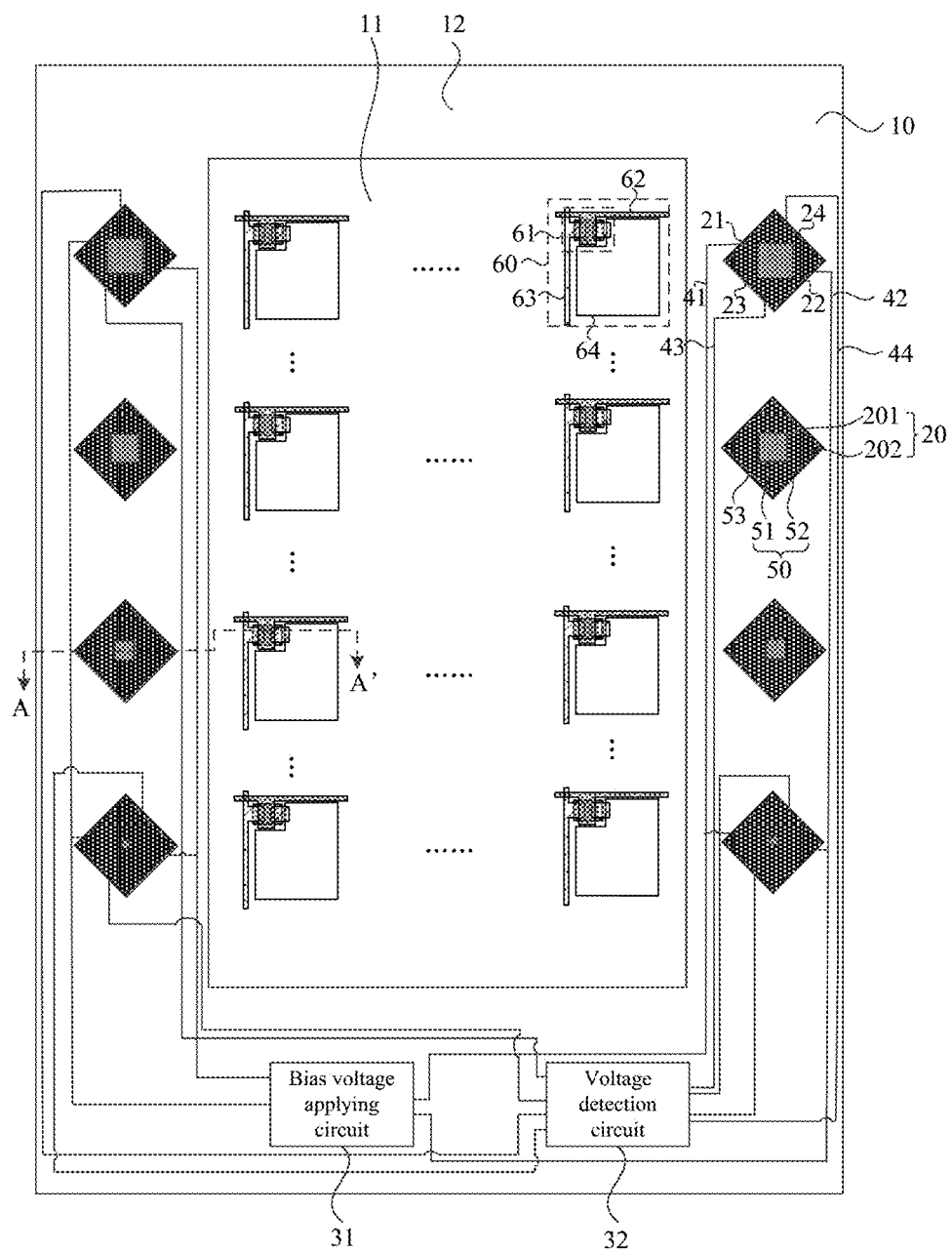
FIG. 17 is a structural schematic diagram of another array substrate provided by an embodiment of the present disclosure.
Figure 18:
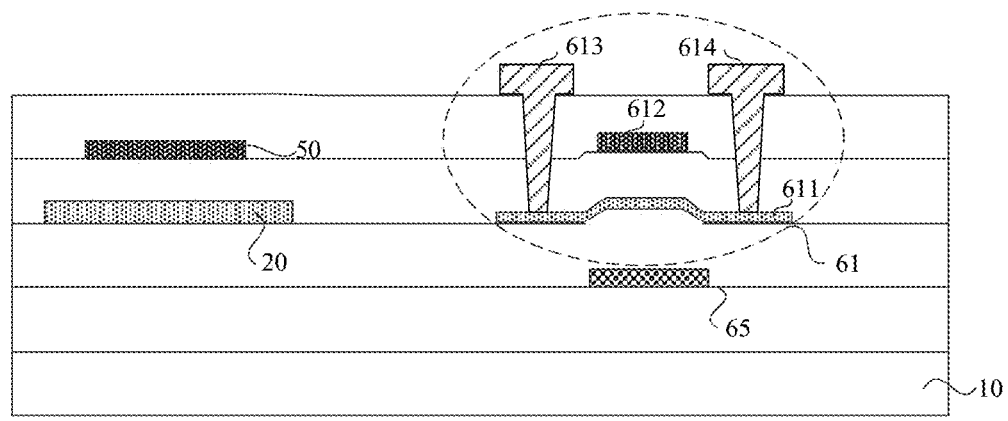
FIG. 18 is a cross sectional structural schematic diagram of the array substrate taken along a section line A-A' in FIG. 17.

FIG. 17 is a structural schematic diagram of another array substrate provided by an embodiment of the present disclosure. As shown in FIG. 17, the array substrate provided by embodiments of the present disclosure further includes thin film transistors 61. A plurality of pixel units 60 are provided on the array substrate. Each pixel unit 60 is provided with the thin film transistor 61. The thin film transistor 61 is electrically connected to a scan line 62 and a data line 63, respectively. The thin film transistor 61 serves as a switch device for controlling the display of a pixel electrode 64 connected thereto. FIG. 18 is a cross sectional structural schematic diagram of the array substrate taken along a section line A-A' in FIG. 17. As shown in FIG. 18, the thin film transistor 61 includes an active layer 611, and a drain electrode 614, a source electrode 613 and a gate electrode 612 arranged at a side of the active layer 611 away from the base substrate 10. The active layer 611 may be arranged at a same layer as the semiconductor pressure sensor 20. The gate electrode 612 may be arranged at a same layer as the blocking pattern layer 50. Exemplarily, the active layer 611 is arranged at the same layer as the semiconductor pressure sensor 20 and the gate electrode 612 is arranged at the same layer as the blocking pattern layer 50, so that films of the array substrate are configured in a simple manner and it is easy to achieve a thin design of the array substrate. Moreover, the active layer 611 is arranged at the same layer as the semiconductor pressure sensor 20 and the gate electrode 612 is located on the active layer 611, and also the blocking pattern layer 50 needs to be located on the semiconductor pressure sensor 20. The configuration of the gate electrode 612 and the blocking pattern layer 50 in the same layer can also ensure that the semiconductor pressure sensor 20 and the active layer 611 are manufactured simultaneously. The gate electrode 612 and the blocking pattern layer 50 are manufactured simultaneously by using the same one mask, saving an additional mask required for manufacturing the blocking pattern layer 50 and ensuring the fabricating process of the array substrate simple and efficient.

Optionally, as shown in FIG. 18, the array substrate provided by embodiments of the present disclosure further includes a blocking layer 65 for preventing external light from entering a channel region of the active layer 611, avoiding a light leakage current formed by irradiation of the external light on the channel region of the active layer 611 and avoiding affecting the normal operation of the array substrate.

Optionally, the material of the semiconductor pressure sensor 20 may be the same as the material of the active layer 611, for example may be a polysilicon film or amorphous silicon film.

Optionally, still referring to FIG. 17, the array substrate may include a display region 11 and a non-display region 12 surrounding the display region 11. The semiconductor pressure sensors 20 may be disposed in the display region 11 and/or the non-display region 12. The bias voltage applying circuit 31 may be disposed in the non-display region 12. The thin film transistors 61 may be disposed in the display region 11. FIG. 17 merely illustrates an example that the semiconductor pressure sensors 20 and the bias voltage applying circuit 31 are disposed in the non-display region 12 and the thin film transistors 61 are disposed in the display region 11.

Optionally, still referring to FIG. 1, first power supply inputting terminals 21 of at least two semiconductor pressure sensors 20 are electrically connected to the bias voltage applying circuit 31 via a same first power supply signal line 41, and second power supply inputting terminals 22 of at least two semiconductor pressure sensors 20 are electrically connected to the bias voltage applying circuit 31 via a same second power supply signal line 42. In order to reduce the number of wires, multiple semiconductor pressure sensors 20 are arranged to share the power signal line. As show in FIG. 1, multiple semiconductor pressure sensors 20 are electrically connected to the bias voltage applying circuit 31 via the first power supply signal line 41 and the second power supply signal line 42. Multiple semiconductor pressure sensors 20 are connected in parallel with each other to reduce the number of the power supply signal lines. When the semiconductor pressure sensors 20 are disposed within the non-display region 12, a narrow bezel design of the array substrate can be achieved by reducing the number of the power supply signal lines. When the semiconductor pressure sensors 20 are disposed within the display region 11, by reducing the number of the power supply signal lines, it can ensure a large aperture ratio of the display region and a display effect of the array substrate.

Optionally, still referring to FIG. 1, the array substrate provided by embodiments of the present disclosure further includes a voltage detection circuit 32 disposed at a side of the array substrate 10. The voltage detection circuit 32 is electrically connected to a first inductive signal measuring terminal 23 of the semiconductor pressure sensor 20 via a first induction measurement signal line 43, and the voltage detection circuit 32 is electrically connected to a second inductive signal measuring terminal 24 of the semiconductor pressure sensor 20 via a second induction measurement signal line 44, in order to obtain a strain voltage of the semiconductor pressure sensor 20. It should be noted that FIG. 1 just illustrates the first induction measurement signal line 43 and the second induction measurement signal line 44 corresponding to the semiconductor pressure sensor 20 nearest to the bias voltage applying circuit 31 and the first induction measurement signal line 43 and the second induction measurement signal line 44 corresponding to the semiconductor pressure sensor 20 farthest away from the bias voltage applying circuit 31, and the first induction measurement signal lines 43 and the second induction measurement signal lines 44 corresponding to the semiconductor pressure sensors 20 at other positions are not illustrated.

Figure 19:
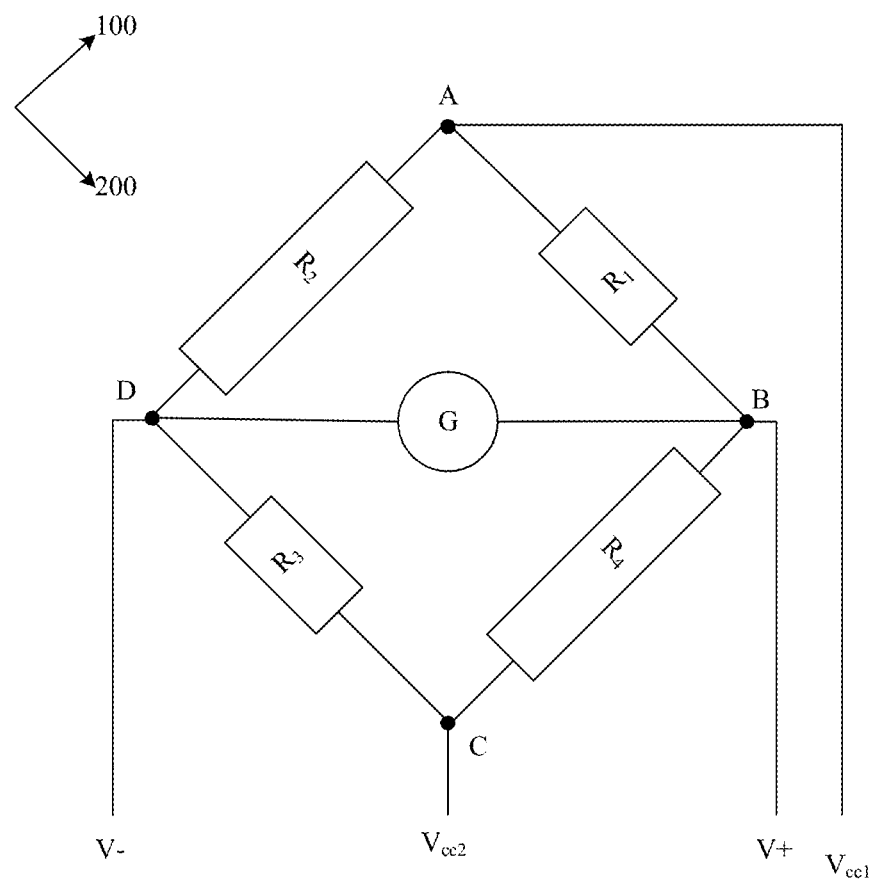
FIG. 19 is an equivalent circuit diagram of a semiconductor pressure sensor provided by an embodiment of the present disclosure.

Exemplarily, FIG. 19 is an equivalent circuit diagram of a semiconductor pressure sensor provided by an embodiment of the present disclosure. As shown in FIG. 19, the semiconductor pressure sensor can be equivalent to a Wheatstone bridge structure. Four arms of the bridge (that is, a first pressure inductive resistor R1, a second pressure inductive resistor R2, a third pressure inductive resistor R3 and a fourth pressure inductive resistor R4) are connected to form a quadrangle ABCD. The first pressure inductive resistor R1 and the third pressure inductive resistor R3 are configured to sense a strain variation in a first direction 100. The second pressure inductive resistor R2 and the fourth pressure inductive resistor R4 are configured to sense a strain variation in a second direction 200. A diagonal BD of the quadrangle ABCD is connected with a galvanometer G. Two electrodes of the galvanometer G are connected to a first inductive signal measurement signal line V+ and a second inductive signal measurement signal line V−, respectively. A node A of a diagonal AC of the quadrangle ABCD is connected to a first power supply input signal line Vcc1. A node C of the diagonal AC of the quadrangle ABCD is connected to a second power supply input signal line Vcc2. When there is a certain difference between a voltage provided by the first power supply input signal line Vcc1 and a voltage provided by the second power supply input signal line Vcc2, current flows through each branch of the bridge circuitry. When the resistances values of the first pressure inductive resistor R1, the second pressure inductive resistor R2, the third pressure inductive resistor R3 and the fourth pressure inductive resistor R4 meet the formula R1/R4=R2/R3, a potential of a node B and a potential of a node D are equal, a current flowing through the galvanometer G is zero. A pointer of the galvanometer G indicates zero, and the bridge is at an equilibrium state. R1/R4=R2/R3 is referred to as a bridge equilibrium condition. When the resistances values of the first pressure inductive resistor R1, the second pressure inductive resistor R2, the third pressure inductive resistor R3 and the fourth pressure inductive resistor R4 fail to meet the above bridge equilibrium condition, the potential of the node B and the potential of the node D are not equal. At this time, the current flowing through the galvanometer G is not zero, the pointer of the galvanometer G deflects, the corresponding signal value is outputted, and then a touch pressure value is determined.

Optionally, still referring to FIG. 1, the semiconductor pressure sensor 20 may be in a block shape. The shape of the semiconductor pressure sensor 20 may be a polygonal including at least four edges. FIG. 1 merely illustrates an example that the shape of the semiconductor pressure sensor 20 is a rectangle. The first power supply signal inputting terminal 21, the second power supply signal inputting terminal 22, the first inductive signal measuring terminal 23 and the second inductive signal measuring terminal 24 are disposed at four edges of the polygonal respectively. An edge where the first power supply signal inputting terminal 21 is located is not connected to an edge where the second power supply signal inputting terminal 22 is located, and an edge where the first inductive signal measuring terminal 23 is located is not connected to an edge where the second inductive signal measuring terminal 24 is located. The first power supply signal inputting terminal 21 and the second power supply signal inputting terminal 22 are configured to sense the strain in the first direction 100. The first inductive signal measuring terminal 23 and the second inductive signal measuring terminal 24 are configured to sense the strain in the second direction 200.

Optionally, still referring to FIG. 1, the array substrate further includes a first edge 101. The semiconductor pressure sensor 20 is in a square shape. An included angle between the first edge 101 and each of a line where the first power supply signal inputting terminal 21 is located and a line where the second power supply signal inputting terminal 22 is located is 45 degrees. An included angle between the first edge 101 and each of a line where the first inductive signal measuring terminal 23 is located and a line where the second inductive signal measuring terminal 24 is located is 45 degrees. It is ensured that the semiconductor pressure sensor 20 has a high sensitivity during pressure detection.

Figure 20:
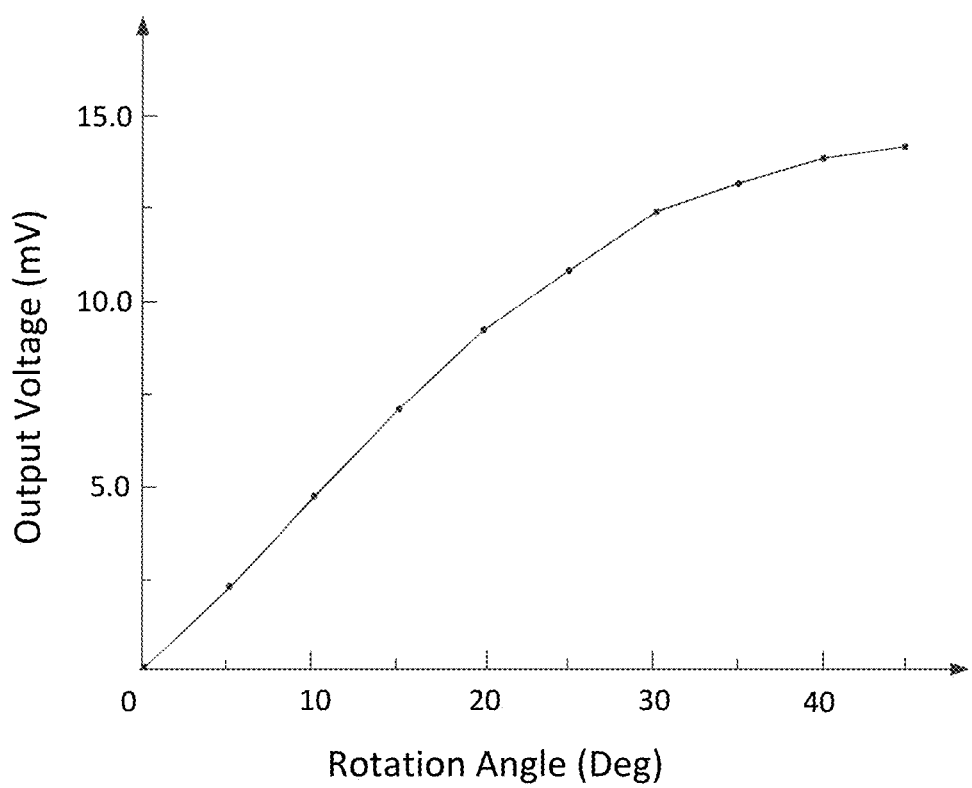
FIG. 20 is a graph showing a relationship between strain voltage variation of a strain voltage on a semiconductor pressure sensor and variation of an rotation angle provided by an embodiment of the present disclosure.

Exemplarily, FIG. 0.20 is a graph showing a relationship between variation of a strain voltage of a semiconductor pressure sensor and variation of an included angle provided by an embodiment of the present disclosure. As shown in FIG. 20, the horizontal coordinate denotes a magnitude of the included angle α (Rotation Angle) between the first edge 101 and the line between the first power supply signal inputting terminal and the second power supply signal inputting terminal, and the longitudinal coordinate denotes an Output Voltage outputted from the semiconductor pressure sensor. As can be seen from FIG. 20, if the semiconductor pressure sensors 20 are subjected to the same pressure, the semiconductor pressure sensors have the largest strain voltage when the included angle α between the semiconductor pressure sensor and the first edge 101 is 45 degrees. As a result, in the specific design, the included angle between the first edge 101 and the line between the first power supply signal inputting terminal and the second power supply signal inputting terminal is configured to be 45 degrees, so that the stain voltage is large when the semiconductor pressure sensor is subjected to a pressure, thereby ensuring that the semiconductor pressure sensor has a high sensitivity during pressure detection.

Figure 21:
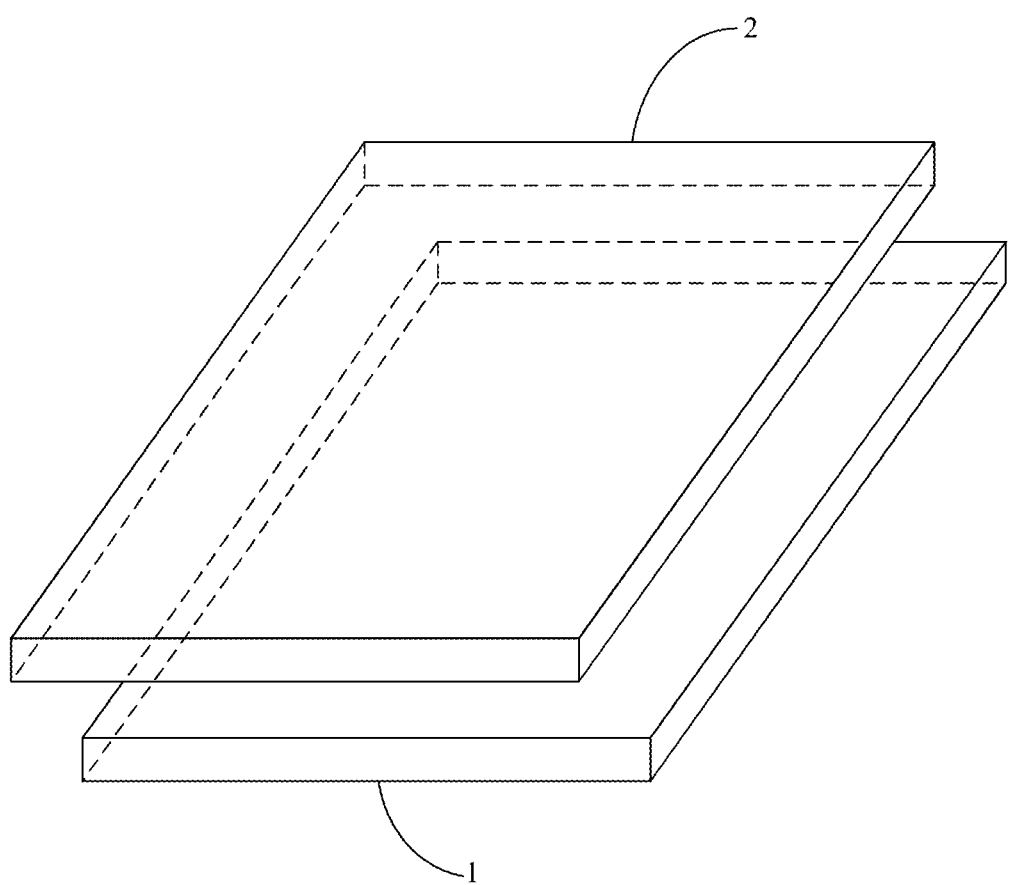
FIG. 21 is a structural schematic diagram of a display panel provided by an embodiment of the present disclosure.

FIG. 21 is a structural schematic diagram of a display panel provided by an embodiment of the present disclosure. As shown in FIG. 21, the display panel provided by embodiments of the present disclosure includes an array substrate 1 described in the above embodiments and an opposing substrate 2 oppositely disposed with the array substrate 1. The counter substrate 2 may be a color filter substrate. Alternatively, the counter substrate 2 may be a cover plate or another encapsulation layer. The type of the display panel is not limited in embodiments of the present disclosure. The display panel may be a Liquid Crystal Display (LCD) display panel, an Organic Light Emitting Diode (OLED) display panel or a Micro LED display panel.

Figure 22:
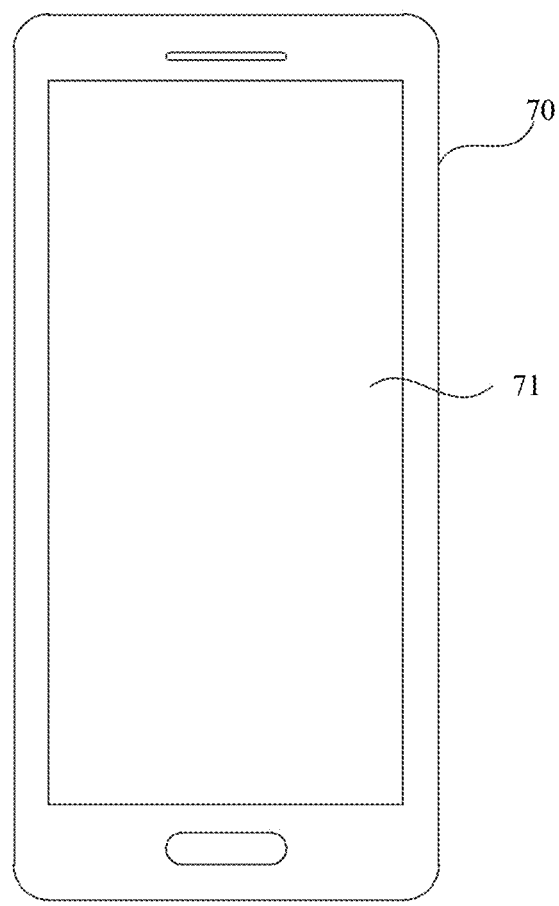
FIG. 22 is a structural schematic diagram of a display device provided by an embodiment of the present disclosure.

FIG. 22 is a structural schematic diagram of a display device provided by an embodiment of the present disclosure. As shown in FIG. 22, the display device 70 may include a display panel 71 in any embodiment of the present disclosure. The display device 70 may be a mobile phone shown in FIG. 22. Alternatively, the display device 70 may be a computer, a television, a smart wearable display device and the like, which is not specifically limited in embodiments of the present disclosure.

Note that the foregoing is only the preferred embodiment of the present disclosure and the applied technical principles. Those skilled in the art should understand that the present disclosure is not limited to the specific embodiments described herein, and various obvious changes, readjustments, combinations and substitutions can be made by those skilled in the art without departing from the scope of the present disclosure. Therefore, although the present disclosure has been described in detail by way of the above embodiments, the present disclosure is not limited to the above embodiments and more other equivalent embodiments may be included without departing from the concept of the present disclosure. However, the scope of which is determined by the scope of the appended claims.

What is claimed is:
1. An array substrate, comprising:
a base substrate having a first side;
a bias voltage applying circuit and a plurality of semiconductor pressure sensors disposed on the first side of the base substrate;
wherein at least two of the plurality of semiconductor pressure sensors each has a first power supply signal inputting terminal and a second power supply signal inputting terminal;
wherein the at least two pressure sensors share a common first power supply signal line at the first power supply signal inputting terminals;

wherein the at least two pressure sensors also share a common second power supply signal line at the second power supply signal inputting terminals;

wherein the bias voltage applying circuit is electrically connected to each of the first power supply signal inputting terminals via the common first power supply signal line and electrically connected to each of the second power supply signal inputting terminals via the common second power supply signal line, wherein a bias voltage is supplied to each of the at least two said semiconductor pressure sensors by said bias voltage applying circuit;

wherein the plurality of semiconductor pressure sensors each comprises dopant ions; and wherein a concentration of the dopant ions in the plurality of semiconductor pressure sensors is higher close to the bias voltage applying circuit than farther away from the bias voltage applying circuit, so that an electrical resistance value of the plurality of semiconductor pressure sensors is lower close to the bias voltage applying circuit than an electrical resistance value of the plurality of semiconductor pressure sensors farther away from the bias voltage applying circuit.

2. The array substrate according to claim 1, further comprising a blocking pattern layer located at a side of the plurality of semiconductor pressure sensors away from the base substrate, wherein a perpendicular projection of the blocking pattern layer on the base substrate is overlapped with a perpendicular projection of the semiconductor pressure sensor on the base substrate;

wherein the blocking pattern layer comprises blocking region and blocking-free region;

wherein an area of the blocking-free region of the blocking pattern layer is greater when an associated one of the plurality of the semiconductor pressure sensors is closer to the bias voltage applying circuit; and wherein a higher ion doping concentration is provided on said semiconductor pressure sensor through the blocking-free region.

3. The array substrate according to claim 2, wherein the blocking regions of the blocking pattern layer comprises blocking patterns, wherein the blocking patterns have a higher distribution density when said semiconductor pressure sensor is closer to the bias voltage applying circuit.

4. The array substrate according to claim 3, wherein the blocking patterns are a plurality of square patterns having a same shape and are concentric with the corresponding semiconductor pressure sensor, wherein each of the plurality of square patterns is formed of a plurality of discontinuous dot-shaped patterns, and an distance between adjacent two of the square patterns corresponding to said semiconductor pressure sensor is equal; and wherein a distance is greater between adjacent two of the concentric squares when said sensor is closer to the bias voltage applying circuit.

5. The array substrate according to claim 3, wherein the blocking patterns are a plurality of dot-shaped patterns arranged in arrays, wherein perpendicular projections of the plurality of dot-shaped patterns on the base substrate are uniformly distributed inside the perpendicular projection of the corresponding semiconductor pressure sensor on the base substrate; and wherein a number of dot-shaped patterns is less when said semiconductor pressure sensor is closer to the bias voltage applying circuit.

6. The array substrate according to claim 3, wherein the blocking patterns comprises a first blocking pattern, a second blocking pattern, a third blocking pattern and a fourth blocking pattern, wherein perpendicular projections of the first blocking pattern, the second blocking pattern, the third blocking pattern and the fourth blocking pattern on the base substrate are uniformly distributed within the perpendicular projection of the corresponding semiconductor pressure sensor on the base substrate, and wherein each of the first blocking pattern, the second blocking pattern, the third blocking pattern and the fourth blocking pattern comprises a plurality of parallel striped patterns, wherein extension directions of striped patterns of adjacent two of the first blocking pattern, the second blocking pattern, the third blocking pattern and the fourth blocking pattern are perpendicular to each other; and wherein a number of the plurality of striped patterns in the blocking pattern enclosing the semiconductor pressure sensor close to the bias voltage applying circuit is less than a number of the plurality of striped patterns in the blocking pattern corresponding to the semiconductor pressure sensor remote from the bias voltage applying circuit.

7. The array substrate according to claim 2, wherein the blocking region of the blocking pattern layer comprises blocking patterns, and wherein an area of the blocking pattern of the blocking pattern layer is less when said semiconductor pressure sensor is closer to the bias voltage applying circuit.

8. The array substrate according to claim 7, wherein the blocking patterns are square patterns having a same shape as the plurality of semiconductor pressure sensors, each of the square patterns is composed of a plurality of striped patterns connected end to end and parallel to edges of the corresponding semiconductor pressure sensor;

wherein a perpendicular projection of the square patterns on the base substrate are located within the perpendicular projection of the corresponding semiconductor pressure sensor on the base substrate, and a center of the perpendicular projections of the square patterns on the base substrate overlaps with a center of the perpendicular projection of the corresponding semiconductor pressure sensor on the base substrate; and wherein a width of the striped pattern of the square pattern is less when said semiconductor pressure sensor is closer to the bias voltage applying circuit.

9. The array substrate according to claim 7, wherein the blocking patterns are block patterns having a same shape as the corresponding semiconductor pressure sensor, wherein perpendicular projections of the block patterns on the base substrate are concentric to a perpendicular projection of the corresponding semiconductor pressure sensor on the base substrate; and wherein, an area of the block pattern is less when said semiconductor pressure sensor is closer to the bias voltage applying circuit.

10. The array substrate according to claim 7, wherein the blocking patterns comprises a first blocking pattern, a second blocking pattern, a third blocking pattern and a fourth blocking pattern, perpendicular projections of the first blocking pattern, the second blocking pattern, the third blocking pattern and the fourth blocking pattern on the base substrate are uniformly distributed in the perpendicular projection of the corresponding semiconductor pressure sensor on the base substrate, and each of the first blocking pattern, the second blocking pattern, the third blocking pattern and the fourth blocking pattern comprises a plurality of parallel striped patterns, wherein extension directions of striped patterns of adjacent two of the first blocking pattern, the second blocking pattern, the third blocking pattern and the fourth blocking pattern are perpendicular to each other; and wherein an area of the striped patterns in each of the blocking patterns is less when said semiconductor pressure sensor is closer to the bias voltage applying circuit.

11. The array substrate according to claim 2,
wherein the plurality of semiconductor pressure sensors comprises a first region and a second region,
wherein a perpendicular projection of the first region on the base substrate overlaps with a perpendicular projection of the blocking region on the base substrate, and a perpendicular projection of the second region on the base substrate overlaps with a perpendicular projection of the blocking-free region on the base substrate; and
wherein the first power supply signal line and the second power supply signal line are both electrically connected to the second region overlapping the blocking-free regions.

12. The array substrate according to claim 2, further comprising
a thin film transistor disposed at a side of the base substrate, wherein the thin film transistor comprising an active layer, and a gate electrode arranged at a side of the active layer away from the base substrate;
wherein the active layer is arranged at a same layer as the semiconductor pressure sensor; and
wherein the gate electrode is arranged at a same layer as the blocking pattern layer.

13. The array substrate according to claim 1, further comprising
a voltage detection circuit disposed at a side of the base substrate,
wherein the voltage detection circuit is electrically connected to a first inductive signal measuring terminal of the semiconductor pressure sensor via a first induction measurement signal line, the voltage detection circuit is electrically connected to a second inductive signal measuring terminals of the semiconductor pressure sensor via a second induction measurement signal line, in order to obtain a strain voltage of the semiconductor pressure sensor;
wherein the semiconductor pressure sensor is defined as a block shape and a shape thereof is a polygonal including at least four edges; and
wherein the first power supply signal inputting terminal, the second power supply signal inputting terminal, the first inductive signal measuring terminal and the second inductive signal measuring terminal are arranged at the four edges of the polygonal, respectively, an edge where the first power supply signal inputting terminal is located is not connected to an edge where the second power supply signal inputting terminal is located, and an edge where the first inductive signal measuring terminal is located is not connected to an edge where the second inductive signal measuring terminal is located.

14. The array substrate according to claim 13, further comprising
a first edge, wherein each of the plurality of semiconductor pressure sensors is shaped as a square, and an included angle between the first edge and either a line where the first power supply signal inputting terminal is located or a line where the second power supply signal inputting terminal is located is 45 degrees.

15. The array substrate according to claim 1, further comprising
a display region and a non-display region surrounding the display region, wherein the plurality of semiconductor pressure sensors is arranged in at least one of the display region and the non-display region, and
wherein the bias voltage applying circuit is arranged in the non-display region.

16. The array substrate according to claim 1, wherein the plurality of semiconductor pressure sensors comprises a polysilicon film or amorphous silicon film.

17. The array substrate according to claim 1, wherein dopant ions of the plurality of semiconductor pressure sensors are P-type ions or N-type ions.

18. The array substrate according to claim 17, wherein the dopant ions of the plurality of semiconductor pressure sensors are Boron ions.

19. A display panel, comprising an array substrate and an opposing substrate disposed to be opposite to the array substrate, wherein the array substrate comprises:
a base substrate, and a bias voltage applying circuit and a plurality of semiconductor pressure sensors are all disposed at a side of the base substrate;
wherein at least two of the plurality of semiconductor pressure sensors each has a first power supply signal inputting terminal and a second power supply signal inputting terminal;
wherein the at least two pressure sensors share a common first power supply signal line at the first power supply signal inputting terminals;
wherein the at least two pressure sensors also share a common second power supply signal line at the second power supply signal inputting terminals;
wherein the bias voltage applying circuit is electrically connected to each of the first power supply signal inputting terminals via the common first power supply signal line and electrically connected to each of the second power supply signal inputting terminals via the common second power supply signal line, wherein a bias voltage is supplied to each of the at least two said semiconductor pressure sensors by said bias voltage applying circuit;
wherein the plurality of semiconductor pressure sensors each comprises dopant ions; and
wherein a concentration of the dopant ions in the plurality of semiconductor pressure sensors is higher close to the bias voltage applying circuit than farther away from the bias voltage applying circuit, so that an electrical resistance value of the plurality of semiconductor pressure sensors is lower close to the bias voltage applying circuit than an electrical resistance value of the plurality of semiconductor pressure sensors farther away from the bias voltage applying circuit.

20. A display device, comprising a display panel comprising an array substrate and an opposing substrate disposed to be opposite to the array substrate, wherein the array substrate comprises:

a base substrate, and a bias voltage applying circuit and a plurality of semiconductor pressure sensors are all disposed at a side of the base substrate;

wherein at least two of the plurality of semiconductor pressure sensors each has a first power supply signal inputting terminal and a second power supply signal inputting terminal;

wherein the at least two pressure sensors share a common first power supply signal line at the first power supply signal inputting terminals;

wherein the at least two pressure sensors also share a common second power supply signal line at the second power supply signal inputting terminals;

wherein the bias voltage applying circuit is electrically connected to each of the first power supply signal inputting terminals via the common first power supply signal line and electrically connected to each of the second power supply signal inputting terminals via the common second power supply signal line, wherein a bias voltage is supplied to each of the at least two said semiconductor pressure sensors by said bias voltage applying circuit;

wherein the plurality of semiconductor pressure sensors each comprises dopant ions; and wherein a concentration of the dopant ions in the plurality of semiconductor pressure sensors is higher close to the bias voltage applying circuit than farther away from the bias voltage applying circuit, so that an electrical resistance value of the plurality of semiconductor pressure sensors is lower close to the bias voltage applying circuit than an electrical resistance value of the plurality of semiconductor pressure sensors farther away from the bias voltage applying circuit.

* * * * *